United States Patent
Otsu et al.

(10) Patent No.: US 11,742,226 B2
(45) Date of Patent: Aug. 29, 2023

(54) SUBSTRATE LIQUID PROCESSING APPARATUS

(71) Applicant: Tokyo Electron Limited, Tokyo (JP)

(72) Inventors: Takahiko Otsu, Kumamoto (JP); Kazuya Koyama, Kumamoto (JP); Takao Inada, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 409 days.

(21) Appl. No.: 16/727,007

(22) Filed: Dec. 26, 2019

(65) Prior Publication Data
US 2020/0211865 A1  Jul. 2, 2020

(30) Foreign Application Priority Data

Dec. 27, 2018 (JP) ................ 2018-245424

(51) Int. Cl.
*B05B 12/14* (2006.01)
*H01L 21/67* (2006.01)
*B08B 3/04* (2006.01)

(52) U.S. Cl.
CPC ...... *H01L 21/6715* (2013.01); *B05B 12/1409* (2013.01); *B08B 3/048* (2013.01); *H01L 21/67023* (2013.01); *H01L 21/67028* (2013.01); *H01L 21/67051* (2013.01); *H01L 21/67057* (2013.01); *H01L 21/67086* (2013.01)

(58) Field of Classification Search
CPC .......... H01L 21/6715; H01L 21/67023; H01L 21/67028; H01L 21/67051; H01L 21/67057; H01L 21/67086; H01L 21/67173; H01L 21/67757; H01L 21/67034; H01L 21/67017; B05B 12/1409; B08B 3/048; B08B 3/10
See application file for complete search history.

(56) References Cited

U.S. PATENT DOCUMENTS 5,282,923 A * 2/1994 Cannizzaro, Jr. ............ H01L 21/67075
438/747
5,482,068 A * 1/1996 Kitahara ............ H01L 21/67057
134/182
(Continued)

FOREIGN PATENT DOCUMENTS

JP H04-048629 A 2/1992
JP H09-10709 A 1/1997
(Continued)

*Primary Examiner* — Alexander Markoff
(74) *Attorney, Agent, or Firm* — Venjuris, P.C.

(57) ABSTRACT

A substrate processing apparatus includes: a processing tank that stores a processing liquid for performing a liquid processing on a plurality of substrates; a substrate support that supports the plurality of substrates such that main surfaces of each of the plurality of substrates follow a vertical direction in the processing tank; a processing liquid ejection unit provided below the plurality of substrates supported by the substrate support, and generates an ascending flow of the processing liquid in the processing tank; and a rectifying section that adjusts flow of the processing liquid in a side space formed between a first side wall of the processing tank and a first substrate having a main surface facing the first side wall of the processing tank among the plurality of substrates.

19 Claims, 14 Drawing Sheets

(56) References Cited

U.S. PATENT DOCUMENTS

| | | | | |
|---|---|---|---|---|
| 6,138,698 | A | * | 10/2000 | Tanaka .............. H01L 21/67051 |
| | | | | 134/184 |
| 2011/0079240 | A1 | * | 4/2011 | Kamikawa .............. B08B 3/048 |
| | | | | 134/1 |
| 2011/0290279 | A1 | * | 12/2011 | Hyakutake ........ H01L 21/67109 |
| | | | | 134/105 |
| 2015/0197861 | A1 | * | 7/2015 | Tice .................. H01L 21/68771 |
| | | | | 156/345.23 |
| 2017/0117167 | A1 | * | 4/2017 | Tice .......................... C23F 1/08 |
| 2018/0218924 | A1 | * | 8/2018 | Tanaka .............. H01L 21/67742 |

FOREIGN PATENT DOCUMENTS

| | | | |
|---|---|---|---|
| JP | 10098017 A | * | 4/1998 |
| JP | 2000-077374 A | | 3/2000 |
| JP | 2009-238802 A | | 10/2009 |
| JP | 2017-195338 A | | 10/2017 |

* cited by examiner

SUBSTRATE LIQUID PROCESSING APPARATUS

CROSS-REFERENCE TO RELATED APPLICATIONS

This application is based on and claims priority from Japanese Patent Application No. 2018-245424, filed on Dec. 27, 2018 with the Japan Patent Office, the disclosure of which is incorporated herein in its entirety by reference.

TECHNICAL FIELD

The present disclosure relates to a substrate liquid processing apparatus.

BACKGROUND

Japanese Patent Laid-Open Publication No. 09-010709 discloses a substrate liquid processing apparatus that performs a chemical liquid processing on a substrate by supporting the substrate in a processing tank that accommodates a chemical liquid. In this substrate liquid processing apparatus, the processing tank is formed of a resin material.

SUMMARY

A substrate liquid processing apparatus according to an aspect of the present disclosure includes: a processing tank configured store a processing liquid for performing a liquid processing on a plurality of substrates; a substrate support configured to support the plurality of substrates such that main surfaces of each of the plurality of substrates is in a vertical direction in the processing tank; a processing liquid ejection unit provided below the plurality of substrates supported by the substrate support, and configured to generate ascending flow by ejecting the processing liquid into the processing tank; and a rectifying section configured to adjust flow of the processing liquid in a side space formed between a first side wall of the processing tank and a first substrate having a main surface facing the first side wall among the plurality of substrates.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
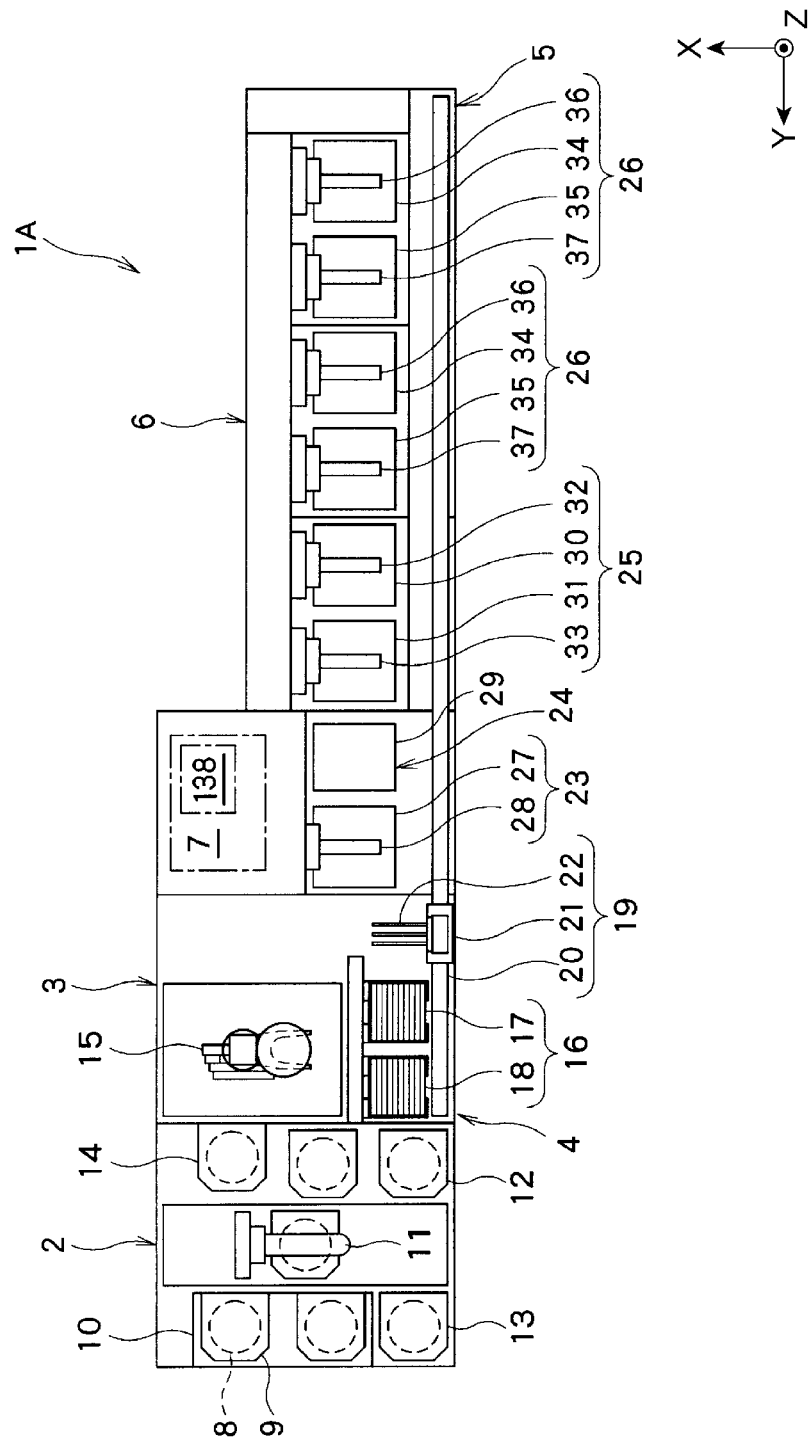
FIG. 1 is a plan view schematically illustrating the configuration of a substrate liquid processing system according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

A substrate liquid processing apparatus according to an aspect of the present disclosure includes: a processing tank configured store a processing liquid for performing a liquid processing on a plurality of substrates; a substrate support configured to support the plurality of substrates such that main surfaces of each of the plurality of substrates is in a vertical direction in the processing tank; a processing liquid ejection unit provided below the plurality of substrates supported by the substrate support, and configured to generate ascending flow by ejecting the processing liquid into the processing tank; and a rectifying section configured to adjust flow of the processing liquid in a side space formed between a first side wall of the processing tank and a first substrate having a main surface facing the first side wall among the plurality of substrates.

In this substrate liquid processing apparatus, a rectifying section configured to adjust the flow of the processing liquid is provided in the side space side space. When the ascending flow of the processing liquid in the side space is disturbed, the processing on the main surface of the first substrate, which faces the first sidewall, may be uneven. In the above configuration, the flow of the processing liquid in the side space is adjusted by the rectifying section, thereby preventing the disturbance of the ascending flow of the processing liquid in the side space. For this reason, since the influence on the substrate liquid processing due to the disturbance of the ascending flow is reduced, it is possible to improve the in-plane uniformity in liquid processing a substrate.

The rectifying section may have a first discharge hole provided in the first side wall and configured to discharge the processing liquid in the processing tank. In this case, since the processing liquid, which has risen inside the processing tank, is capable of being discharged out of the processing tank through the first discharge hole, it is possible to prevent the formation of descending flow in which the processing liquid falls in the side space. For this reason, the disturbance of the ascending flow of the processing liquid in the side space is suppressed. As a result, it is possible to improve the in-plane uniformity in liquid processing a substrate.

The first discharge hole may be provided to face an upper end portion of the first substrate. In this case, it is possible to more appropriately prevent the formation of the above-mentioned descending flow in the side space. As a result, since the disturbance of the ascending flow caused by the descending flow is more reliably suppressed, the in-plane uniformity in liquid processing a substrate is achieved more reliably.

The substrate liquid processing apparatus may further include a second rectifying section having a second discharge hole provided in a second side wall, which is connected to the first side wall, and configured to discharge the processing liquid in the processing tank. In this case, it is possible to discharge the processing liquid, which has risen inside the processing tank, out of the processing tank using the second discharge hole as well. For this reason, since the disturbance of the ascending flow of the processing liquid in the side space is further suppressed, it is possible to further improve the in-plane uniformity in liquid processing a substrate.

The rectifying section may have a plate-shaped member disposed in the side space. The plate-shaped member may be spaced apart from the first substrate and the first sidewall. One main surface of the plate-shaped member may be a facing surface that faces the first substrate. In this case, a part of the process liquid which has risen inside the processing tank is capable of forming descending flow in the space formed between the plate-shaped member in the side space and the first side wall. By forming a space in which the descending flow is capable of being formed, it is possible to prevent the formation of the descending flow in a space different from the above space, and thus the disturbance of the ascending flow along the main surface of the first substrate is suppressed. As a result, it is possible to improve the in-plane uniformity in liquid processing a substrate.

The distance between the first substrate and the plate-shaped member may be smaller than the distance between the plate-shaped member and the first side wall. In this case, the descending flow is more likely to be formed in the space between the plate-shaped member and the first side wall than the space between the first substrate and the plate-shaped member. For this reason, it is possible to more reliably suppress the disturbance of the ascending flow along the main surface of the first substrate, and thus it is possible to more reliably achieve the in-plane uniformity in the liquid processing a substrate.

The rectifying section may have a fixing unit configured to fix the plate-shaped member to the processing tank. In this case, since the plate-shaped member is fixed to the processing tank by the fixing unit, for example, when the substrate support is moved out of the processing tank so as to deliver the plurality of substrates, the plate-shaped member does not affect the delivery of the substrates. As a result, it is possible to achieve both the easy delivery of substrates and the improvement of the in-plane uniformity in processing the substrates.

The substrate support may extend in a direction crossing the vertical direction and the main surface of the first substrate so as to support the plurality of substrates from below. The plate-shape member may be fixed to the substrate support. In this case, the plate-shaped member may be brought closer to the first substrate. In that case, it is possible to further promote the formation of the descending flow between the plate-shaped member and the first side wall. As a result, it is possible to more reliably suppress the disturbance of the ascending flow along the main surface of the first substrate, and thus it is possible to more reliably achieve the in-plane uniformity in liquid processing a substrate.

The substrate support may extend in a direction crossing the vertical direction and the main surface of the first substrate so as to support the plurality of substrates from below. The rectifying section may have a fixing unit configured to fix the plate-shaped member. The plate-shaped member may have a first partition member fixed to the processing tank via the fixing unit, and a second partition member fixed to the substrate support. The first partition member may form a portion of the facing surface. The first partition member may form another portion of the facing surface. In this case, for example, when the substrate support is moved out of the processing tank so as to deliver a plurality of substrates, a space corresponding to the second partition member occurs in the substrate support. For this reason, since it is possible to deliver the plurality of substrates 8 to the space using a member used for delivering the substrates 8, the plate-shaped member hardly affects the delivery of the substrates 8. As a result, it is possible to achieve both the easy delivery of substrates and the improvement of the in-plane uniformity in processing the substrates.

The rectifying section may have a protruding member that protrudes inward from the inner surface of the first side wall and extends along the first side wall in a direction crossing the vertical direction. In this case, the flow directed toward the side space of the processing liquid which has risen inside the processing tank is blocked by the protruding member. As a result, since the disturbance of the ascending flow in the side space is suppressed, it is possible to improve the in-plane uniformity in liquid processing a substrate.

A first distance, which is the distance between the protruding member and the first substrate, may substantially coincide with a second distance, which is a distance between a second substrate adjacent to the first substrate and the first substrate, among the plurality of substrates, or may be smaller the second distance. In this case, since the distance between the protruding member and the first substrate becomes sufficiently small, formation of the flow of the processing liquid which passes between the protruding member and the first substrate is blocked. As a result, since the disturbance of the ascending flow in the side space is more reliably suppressed, the in-plane uniformity in liquid processing a substrate is achieved more reliably.

The protruding member extends to be inclined downward toward opposite outer sides from a central position corresponding to the upper end of the first substrate. In this case, the processing liquid, which has risen inside the processing tank, flows so as to avoid the outside of the first substrate due to the inclination of the protruding member. For this reason, since the disturbance of the ascending flow in the side space is suppressed more reliably, it is possible to improve the in-plane uniformity in liquid processing a substrate.

The side surface of the protruding member, which faces the first substrate, may be inclined to approach the first side wall as it goes downward. In this case, the flow of the processing liquid, which has risen in the side space, is hardly inhibited by the protruding member. As a result, both the reliable execution of the liquid processing and the improvement of the in-plane uniformity are achieved.

Hereinafter, various embodiments will be described in detail with reference to the drawings. In the description, the same elements or elements having the same function will be denoted by the same reference numerals, and a redundant description will be omitted. Hereinafter, XYZ axes orthogonal to each other are defined for the sake of description, and the positive direction of the Z axis is defined as upward in the vertical direction.

First Embodiment

First, a substrate liquid processing system according to a first embodiment will be described with reference to FIGS. 1 to 5.

[Substrate Liquid Processing System]

As illustrated in FIG. 1, a substrate liquid processing apparatus 1A includes a carrier carry-in/out section 2, a lot forming section 3, a lot placement section 4, a lot transport section 5, a lot processing section 6, and a controller 7.

Among these, the carrier carry-in/out section 2 is configured to perform carry-in/out of a carrier 9 containing a plurality of (e.g., 25) substrates (silicon wafers) 8 vertically aligned in a horizontal orientation. The carrier carry-in/out section 2 is provided with a carrier stage 10 on which a plurality of carriers 9 are placed, a carrier transport mechanism 11 configured to transport the carriers 9, carrier stocks 12, 13 configured to temporarily store the carriers 9 therein, and carrier placement tables 14 each configured to place a carrier 9 thereon. Here, the carrier stock 12 temporarily stores substrates 8 to be made into products before processing the substrates 8 in the lot processing section 6. In addition, the carrier stock 13 temporarily stores the substrates 8 to be made into products after processing the substrates 8 in the lot processing section 6.

The carrier carry-in/out section 2 is configured to transport a carrier 9 carried from the outside into the carrier stage 10 to the carrier stock 12 or a carrier placement table 14 using the carrier transport mechanism 11. Then, the carrier carry-in/out section 2 transports the carrier 9 placed on the carrier placement table 14 to the carrier stock 13 or the carrier stage 10 using the carrier transport mechanism 11. The carrier 9 transported to the carrier stage 10 is carried out to the outside.

The lot forming section 3 forms a lot including a plurality of (e.g., 50) substrates 8 to be simultaneously processed by combining the substrates 8 accommodated in one or more carriers 9. In addition, when forming the lot, the lot may be formed such that the pattern-formed surfaces of the substrates 8 face each other, or may be formed such that all the pattern-formed surfaces of the substrates 8 are oriented in one direction. The lot forming section 3 is provided with a substrate transport mechanism 15 configured to transport a plurality of substrates 8. In addition, the substrate transport mechanism 15 is capable of changing the orientation of the substrates 8 from the horizontal orientation to the vertical orientation and from the vertical orientation to the horizontal orientation in the course of transporting the substrates 8.

Then, the lot forming section 3 transports the substrates 8 from the carrier 9 placed on the carrier placement table 14 to the lot placement section 4 using the substrate transport mechanism 15, and places the substrates 8 forming a lot on the lot placement section 4. In addition, in the lot forming section 3, the lot placed on the lot placement section 4 is transported to the carrier 9 placed on the carrier placement table 14 by the substrate transport mechanism 15. In addition, the substrate transport mechanism 15 includes two types of support supports, each configured to support a plurality of substrates 8, i.e., a to-be-processed substrate support configured to support substrates to be processed 8 (before being transported by the lot transport section 5), and a processed substrate support configured to support processed substrates 8 (after being transported by the lot transport section 5). Therefore, for example, particles attached to, for example, the to-be-processed substrates 8 are prevented from being transferred to, for example, processed substrates 8.

In the lot placement section 4, a lot transported between the lot forming section 3 and the lot processing section 6 by the lot transport section 5 is temporarily placed (stands by) on a lot placement table 16. The lot placement section 4 is provided with a carry-in side lot placement table 17 configured to place a processed lot (before being transported by the lot transport section 5) thereon and a carry-out side lot placement table 18 configured to place a to-be-processed lot (after being transported by the lot transport section 5) thereon. A plurality of substrates 8 for one lot are placed side by side in a vertical posture in the front-rear direction on each of the carry-in side lot placement table 17 and the carry-out side lot placement table 18.

Then, in the lot placement section 4, a lot formed in the lot forming section 3 is placed on the carry-in side lot placement table 17, and the lot is carried into the lot processing section 6 via the lot transport section 5. In addition, in the lot placement section 4, the lot carried out from the lot processing section 6 via the lot transport section 5 is placed on the carry-out side lot placement table 18, and the lot is transported to the lot forming section 3.

The lot transport section 5 transports lots between the lot placement section 4 and the lot processing section 6 or between the internal portions the lot processing section 6. The lot transport section 5 is provided with a lot transport mechanism 19 configured to perform lot transport. The lot transport mechanism 19 includes a rail 20 disposed along the lot placement section 4 and the lot processing section 6 and a moving body 21 configured to move along the rail 20 in the state of holding a plurality of substrates 8. A substrate holder 22 configured to hold a plurality of substrates 8 aligned side by side in a vertical orientation in the front-rear direction is provided on the moving body 21 so as to be movable back and forth.

Then, the lot transport section 5 receives the lot placed on the carry-in side lot placement table 17 using the substrate holder 22 of the lot transport mechanism 19, and delivers the lot to the lot processing section 6. In addition, the lot transport section 5 receives the lot processed in the lot processing section 6 using the substrate holder 22 of the lot transport mechanism 19, and delivers the lot to the carry-out side lot placement table 18. In addition, the lot transport section 5 transports the lot within the lot processing section 6 using the lot transport mechanism 19.

The lot processing section 6 performs processings such as, for example, etching, cleaning, and drying on a plurality of substrates 8 aligned side by side in a vertical orientation in the front-rear direction as one lot. The lot processing section 6 include a drying apparatus 23 configured to perform the drying processing of the substrates 8, a substrate holder cleaning apparatus 24 configured to perform the cleaning processing of the substrate holder 22, a cleaning apparatus 25 configured to perform the cleaning processing of the substrates 8, and two etching apparatuses 26 according to the present disclosure configured to perform the etching processing of the substrates 8, in which the apparatuses are provided side by side.

The drying apparatus 23 has a processing tank 27 and a substrate lifting mechanism 28 provided in the processing tank 27 to be movable up and down. A processing gas for drying (e.g., isopropyl alcohol (IPA)) is supplied to the processing tank 27. In the substrate lifting mechanism 28, a plurality of substrates 8 for one lot are held side by side in a vertical orientation in the front-rear direction. The drying apparatus 23 receives the lot from the substrate holder 22 of the lot transport mechanism 19 using the substrate lifting mechanism 28 and moves up and down the lot using the substrate lifting mechanism 28, thereby performing the drying processing of the substrates using the processing gas for drying supplied to the processing tank 27. Further, the drying apparatus 23 delivers the lot from the substrate lifting mechanism 28 to the substrate holder 22 of the lot transport mechanism 19.

The substrate holder cleaning apparatus 24 is configured to be able to supply a processing liquid for cleaning and a drying gas to the processing tank 29. After supplying the processing liquid for cleaning to the substrate holder 22 of the lot transport mechanism 19, the cleaning processing of the substrate holder 22 is performed by supplying the drying gas.

The cleaning apparatus 25 includes a processing tank 30 for cleaning and a processing tank 31 for rinsing, and substrate lifting mechanisms 32, 33 are provided in respective processing tanks 30, 31 so as to be movable up and down. In the processing tank 30 for cleaning, a processing liquid for cleaning (e.g., SC-1) is stored. In the processing tank 31 for rinsing, a processing liquid for rinsing (e.g., pure water) is stored.

The etching apparatus 26 includes a processing tank 34 for etching and a processing tank 35 for rinsing, and substrate lifting mechanisms 36, 37 are provided in respective processing tanks 34, 35 so as to be movable up and down. In the processing tank 34 for etching, a processing liquid for rinsing (e.g., phosphoric acid aqueous solution) is stored. In the processing tank 35 for rinsing, a processing liquid for rinsing (e.g., pure water) is stored.

The cleaning apparatus 25 and the etching apparatus 26 have the same configuration. Referring to the etching process apparatus 26, the substrate lifting mechanism 36 holds a plurality of substrates 8 for one lot are held side by side in a vertical orientation in the front-rear direction (X-axis direction). The etching apparatus 26 receives the lot from the substrate holder 22 of the lot transport mechanism 19 using the substrate lifting mechanism 36 and moves up and down the lot using the substrate lifting mechanism 36, thereby immersing the lot in the processing liquid for etching in the processing tank 34 so as to perform the etching processing of the substrates 8. Thereafter, the etching apparatus 26 delivers the lot from the substrate lifting mechanism 36 to the substrate holder 22 of the lot transport mechanism 19. In addition, the substrate lifting mechanism 37 receives the lot from the substrate holder 22 of the lot transport mechanism 19, and moves up and down the lot by the substrate lifting mechanism 37, thereby immersing the lot in the processing liquid for rinsing in the processing tank 35 so as to perform the rinsing processing of the substrates 8. Thereafter, the lot is delivered from the substrate lifting mechanism 37 to the substrate holder 22 of the lot transport mechanism 19.

The controller 7 controls the operations of respective sections (the carrier carry-in/out section 2, the lot forming section 3, the lot placement section 4, the lot transport section 5, and the lot processing section 6) of the substrate liquid processing system 1A. The controller 7 is configured with, for example, a computer, and has a computer-readable storage medium 138. In the storage medium 138, a program for controlling various processings executed in the substrate liquid processing system 1A is stored. The controller 7 controls the operation of the substrate liquid processing system 1A by reading and executing the program stored in the storage medium 138. In addition, the program stored in the computer-readable storage medium 138 may be installed from another storage medium to the storage medium 138 of the controller 7. The computer-readable storage medium 138 may be, for example, a hard disk (HD), a flexible disk (FD), a compact disk (CD), a magneto optical disk (MO), or a memory card.

[Substrate Liquid Processing Apparatus]

Figure 2:
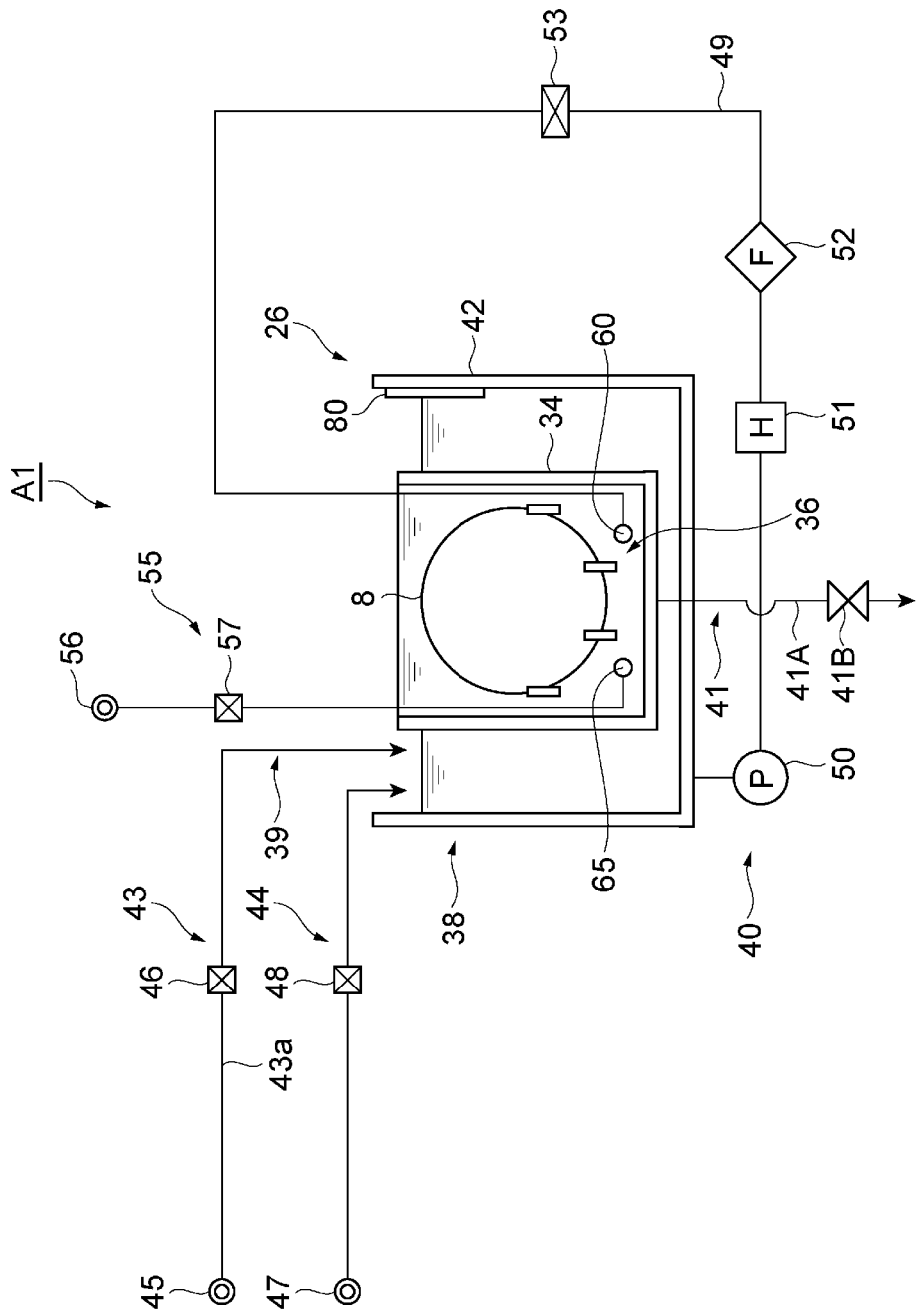
FIG. 2 is a schematic view illustrating a substrate liquid processing apparatus.

Subsequently, a substrate liquid processing apparatus A1 included in the substrate liquid processing system 1A will be described in detail with reference to FIG. 2. As illustrated in FIG. 2, the substrate liquid processing apparatus A1 is configured to include an etching apparatus 26.

The etching apparatus 26 performs a liquid processing (etching) on a substrate 8 using an aqueous solution (phosphoric acid aqueous solution) of a chemical (phosphoric acid) having a predetermined concentration as a processing liquid for etching. Here, the concentration of the phosphoric acid aqueous solution may be appropriately changed. As illustrated in FIG. 2, the etching apparatus 26 includes a processing liquid storage section 38, a processing liquid supply section 39, a processing liquid circulation section 40, a processing liquid discharge section 41, and a gas supply section 55.

The processing liquid storage section 38 stores a processing liquid and processes the substrate 8 using the processing liquid. The processing liquid storage section 38 includes a processing tank 34 and an outer tank 42. In the processing liquid storage section 38, a top-opened outer tank 42 is formed around a top-opened processing tank 34, and stores the processing liquid in the processing tank 34 and the outer tank 42. The processing tank 34 stores the processing liquid such that the substrate 8 is subjected to a liquid processing by being immersed in the processing liquid by the substrate lifting mechanism 36. The outer tank 42 stores the processing liquid overflowing from the processing tank 34. The processing liquid stored in the outer tank 42 is supplied to the processing tank 34 by the processing liquid circulation section 40. The outer tank 42 is provided with a liquid level sensor 80. The liquid level sensor 80 is a sensor that detects the liquid level in the outer tank 42 of the processing liquid storage section 38. As the liquid level sensor 80, various sensors capable of detecting the liquid level may be used. The liquid level sensor 80 outputs information indicating the detected liquid level to the controller 7.

The processing liquid supply section 39 supplies the processing liquid to the processing liquid storage section 38. The processing liquid supply section 39 includes an aqueous solution supply section 43 and a water supply section 44 (a pure water supply section). The aqueous solution supply section 43 includes an aqueous solution supply source 40a and a flow rate regulator 40c.

The aqueous solution supply source 45 supplies phosphoric acid aqueous solution to the processing liquid storage section 38. The phosphoric acid aqueous solution supplied from the aqueous solution supply source 45 is supplied to the processing liquid storage section 38 through a flow path 43a. The flow rate regulator 46 is provided on the downstream side of the aqueous solution supply source 45 in the flow path 43a. The flow rate regulator 46 is connected to the controller 7, and subjected to opening/closing control and flow rate control by the controller 7.

The water supply section 44 supplies water (pure water) to the processing liquid storage section 38. The water supply section 44 connects a water supply source 47 for supplying pure water at a predetermined temperature (e.g., 25□) to the outer tank 42 of the processing liquid storage section 38 via the valve 48. The flow rate regulator 48 is connected to the controller 7, and subjected to opening/closing control and flow rate control by the controller 7.

The processing liquid circulation section 40 sends the processing liquid in the outer tank 42 to the processing tank 34. The processing liquid circulation section 40 includes a circulation flow path 49, a pump 50, a heater 51, a filter 52, and a concentration meter. The circulation flow path 49 is a flow path extending from the bottom portion of the outer tank 42 of the processing liquid storage section 38 to the bottom portion of the processing tank 34. At the end of the circulation flow path 49 in the processing tank 34, a processing liquid ejection member 60 is provided to supply the processing liquid into the processing tank 34. In the circulation flow path 49, a pump 50, a heater 51, and a filter 53 are sequentially provided from the upstream side (the outer tank 42 side) to the downstream side (the processing tank 34 side). The pump 50 and the heater 51 are connected to the controller 7, and subjected to driving control by the controller 7. The pump 50 pumps the processing liquid from the upstream side to the downstream side. The heater 51 heats the processing liquid to a set temperature (e.g., 165□). The filter 52 removes particles mixed in the processing liquid. The concentration meter 53 measures the concentration of a predetermined component (e.g., phosphoric acid) in the processing liquid in the circulation flow path 49. The concentration meter 53 outputs information relating to the measured concentration to the controller 7. In addition, the concentration meter 53 may not be provided.

The processing liquid discharge section 41 discharges the processing liquid from the inside of the processing tank 34. The processing liquid discharge section 41 has, for example, a drainage flow path 41A and a valve 41B. The drainage flow path 41A guides the processing liquid in the processing tank 34. One end of the drainage flow path 41A is connected to the bottom portion of the circulation flow path 34, and the other end of the drainage flow path 41A is connected to a drainage pipe (not illustrated) of the substrate liquid processing system 1A. The valve 41B is provided in the drainage flow path 41A. The valve 41B is connected to the controller 7, and subjected to opening/closing control by the controller 7.

The gas supply section 55 supplies an inert gas into the processing tank 34. The gas supply section 55 includes a gas supply source 56 and a flow rate regulator 57. The gas supply source 56 supplies, for example, nitrogen gas to the processing liquid storage section 38 as the inert gas. The nitrogen gas supplied from the gas supply source 56 is supplied into the processing tank 34 through the flow rate regulator 57. At the end of the gas supply section 55 in the processing tank 34, a gas ejection member 65 is provided to supply the nitrogen gas into the processing tank 34. The flow rate regulator 57 is provided on the downstream side of the gas supply source 56. The flow rate regulator 57 is connected to the controller 7, and subjected to opening/closing control and flow rate control by the controller 7.

(Etching Apparatus)

Figure 3:
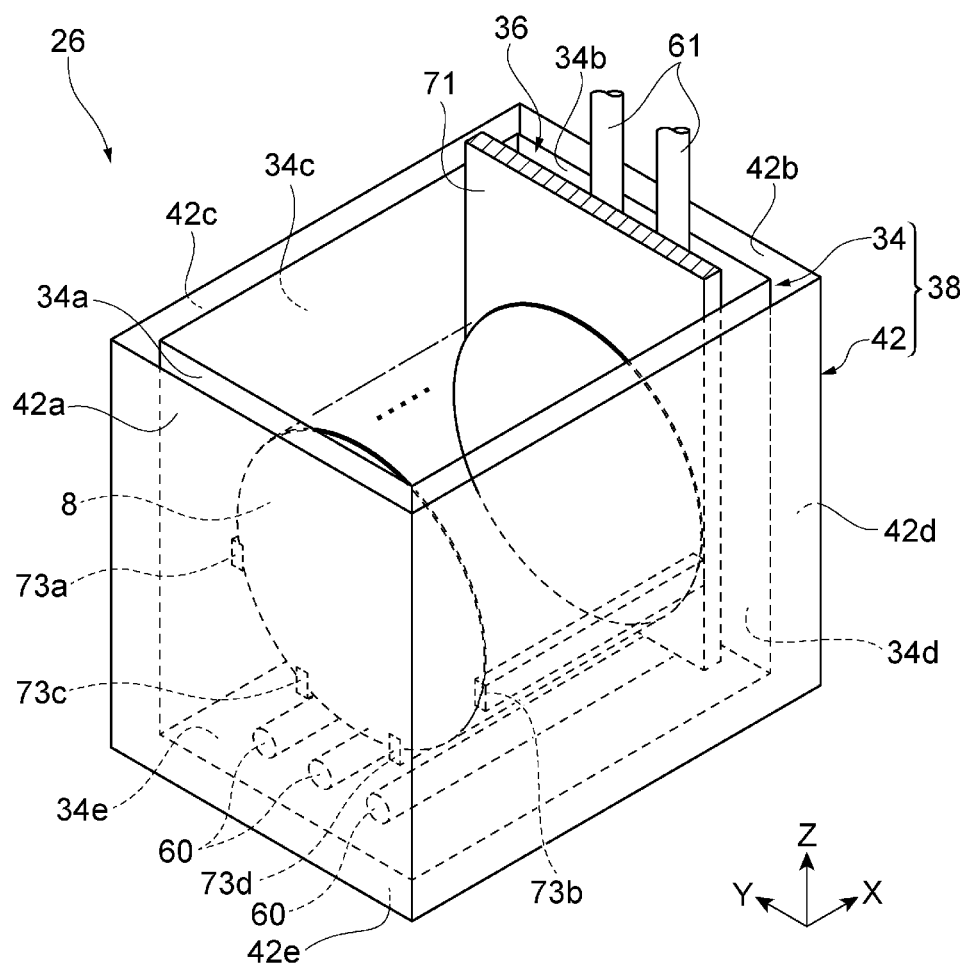
FIG. 3 is a schematic perspective view illustrating the configuration of the substrate liquid processing apparatus.
Figure 4:
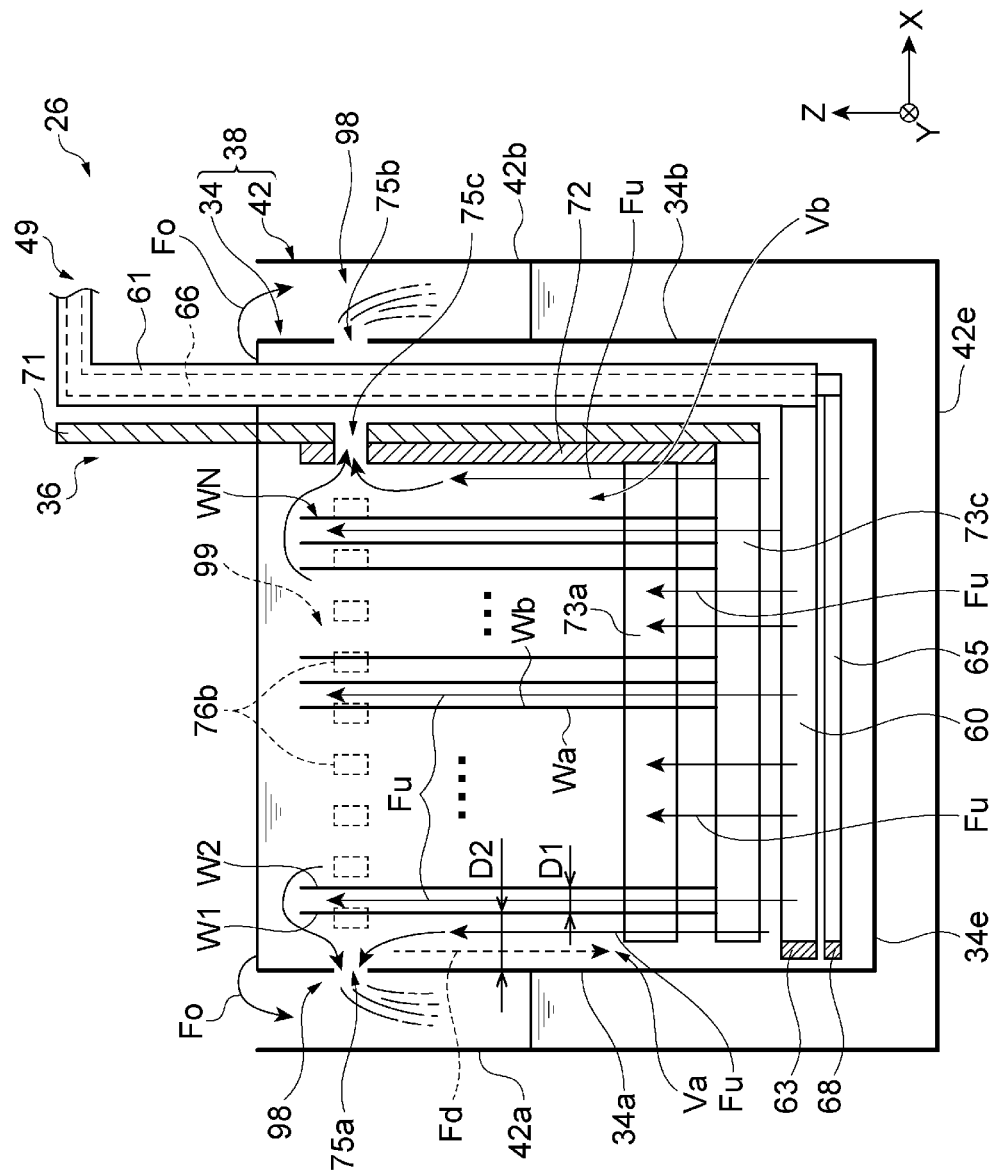
FIG. 4 is a schematic side view illustrating the configuration of the substrate liquid processing apparatus.
Figure 5:
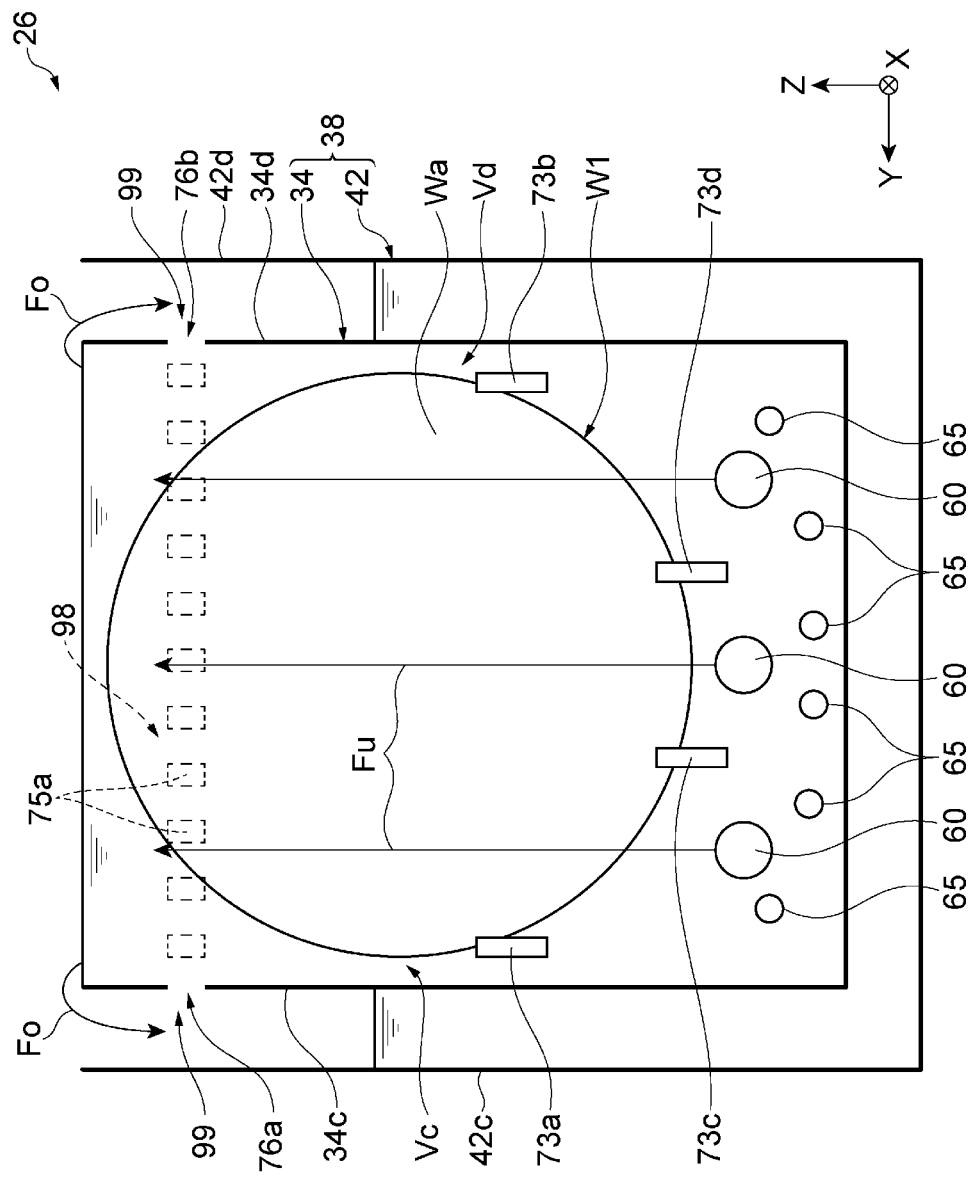
FIG. 5 is a schematic front view illustrating the configuration of the substrate liquid processing apparatus.

Next, an example of the configuration of the etching apparatus 26 will be described in detail with reference to FIGS. 3 to 5. FIGS. 3 to 5 illustrate the vicinity of the processing liquid storage section 38 in the etching apparatus 26.

As illustrated in FIG. 3, the processing tank 34 of the etching apparatus 26 is a top-opened accommodation container. The processing tank 34 has a rectangular parallelepiped shape. Specifically, the processing tank 34 includes a pair of side walls 34a, 34b (first side walls), each extending along the YZ plane, and a pair of side walls 34c, 34d (second side walls), each extending along the XZ plane. In addition, the processing tank 34 has a bottom wall 34e connected to the lower end of each of the side walls 34a to 34d and extending along an XY plane. The side wall 34a and the side wall 34b face each other in the X-axis direction. The side wall 34c and the side wall 34d face each other in the Y-axis direction. A plurality of substrates 8 and a processing liquid for etching the substrates 8 are accommodated in the space (hereinafter, referred to as "storage space in the processing tank 34") defined by virtual planes including the side walls 34a to 34d, the bottom wall 34e, and the upper ends of the side walls 34a to 34d.

The outer tank 42 is formed to accommodate the processing tank 34. The outer tank 42 has a rectangular parallelepiped shape. The outer tank 42 is a top-opened accommodation container. Specifically, the outer tank 42 covers the side walls 34a to 34d and the bottom wall 34e of the processing tank 34. The outer tank 42 includes a pair of side walls 42a, 42b, each extending along the YZ plane, and a pair of side walls 42c, 42d, each extending along the XZ plane. In addition, the processing tank 42 has a bottom wall 42e connected to the lower end of each of the side walls 42a to 42d and extending along the XY plane. The side wall 42a faces the side wall 34a of the processing tank 34, and the side wall 42b faces the side wall 34b of the processing tank 34. The side wall 42c faces the side wall 34c of the processing tank 34, and the side wall 42d faces the side wall 34d of the processing tank 34. That is, the side walls 42a to 42d of the outer tank 42 are provided outside the side walls 34a to 34d of the processing tank 34, respectively. In addition, the bottom wall 42e faces the bottom wall 34e of the processing tank 34 and is provided below the bottom wall 34e (Z axis, negative side).

A space for storing the processing liquid overflowing from the processing tank 34 (hereinafter, referred to a "storage space in the outer tank 42") is formed by the inner surfaces of the side walls 42a to 42d and the inner surface of the bottom wall 42e of the outer tank 42 and the outer surfaces of the side walls 34a to 34d and the outer surface of the bottom wall 34e of the processing tank 34. When the processing liquid supplied to the storage space in the processing tank 34 exceeds the volume of the processing tank 34, the processing liquid flows over each of the upper ends of the side walls 34a to 34d and flows into the storage in the outer tank 42 (overflows). In addition, each of the top openings of the processing tank 34 and the outer tank 42 may be closed by a cover body (not illustrated).

The substrate lifting mechanism 36 supports a plurality of substrates 8 constituting a lot in the processing tank 34 when performing the etching processing, and moves the plurality of substrates 8 up and down before and after the etching processing. As illustrated in FIG. 4, the substrate lifting mechanism 36 supports the plurality of substrates 8 arranged in the horizontal direction (X-axis direction). The main surface of each of the substrates 8 supported by the substrate lifting mechanism 36 extend along the YZ plane. That is, the substrates 8 are supported in a vertical orientation by the substrate lifting mechanism 36 such that each of the main surfaces extends in the vertical direction (Z-axis direction). The substrate lifting mechanism 36 includes a lifting drive unit (not illustrated) provided outside the processing liquid storage section 38, and is movable in the vertical direction (Z-axis direction) by driving of the lifting drive unit. The substrate lifting mechanism 36 includes a support plate 71, a guide plate 72, and a plurality of (e.g., four) substrate support members 73a to 73d (substrate supports).

The support plate 71 is connected to a lifting drive unit (not illustrated) and supports the guide plate 72 and the substrate support members 73a to 73d. The support plate 71 has a plate shape and extends in the vertical direction (Z-axis direction). That is, the support plate 71 is disposed such that the pair of main surfaces extend in the YZ plane. The support plate 71 is disposed adjacent to the side wall 34b in the X-axis direction. The lower end of the support plate 71 is located below the plurality of substrates 8. A guide plate 72 is provided on one main surface of the support plate 71 (the main surface facing the side wall 34a). The guide plate 72 has a disk shape having a size corresponding to the substrates 8 (see also FIG. 4).

The substrate support members 73a to 73d support the plurality of substrates 8 in a vertical orientation. Each of the substrate support members 73a to 73d is a member having a rectangular shape in cross section. Each substrate support member is fixed below the main surface on the side where the guide plate 72 of the support plate 71 is provided (the main surface facing the side wall 34a), and extends in a direction oriented from the main surface toward the side wall 34a (X-axis direction). The substrate support members 73a to 73d are arranged corresponding to the outer shape of the substrates 8 in the state of being accommodated in the processing tank 34. Specifically, when viewed in the X-axis direction, the substrate support members 73a, 73b are arranged on the sides (sides close to the side walls 34c, 34d), and the substrate support members 73c, 73d are arranged in the center (sides far from the side walls 34c, 34d). The substrate support members 73a, 73b are arranged above the substrate support members 73c, 73d. Each of the substrate support members 73a to 73d includes a plurality of (e.g., 50 to 52) of substrate support grooves on the upper surface. The substrate lifting mechanism 36 (the substrate support members 73a to 73d) is capable of holding a plurality of substrates 8 by inserting the peripheral edge portions of the substrates 8 into the substrate support grooves.

Hereinafter, the substrate arranged at the $n^{th}$ (n is an integer from 1 to N) counted from the X-axis negative side among the substrates 8 supported by the substrate lifting mechanism 36 may be referred to as "substrate Wn." For example, a substrate disposed at a position closest to the side wall 34a is referred to as "substrate W1," and a substrate disposed at a position farthest from the side wall 34a is referred to as "substrate WN." Of a pair of main surfaces in each of the substrates 8, the main surface close to the side wall 34a is referred to as "main surface Wa," and the main surface close to the side wall 34b is referred to as "main surface Wb." In addition, a substrate 8 (substrate Wn) in the state of being supported by the substrate lifting mechanism 36 (the substrate support members 73a to 73d) in the processing tank 34 will be simply referred to as "substrate 8 (substrate Wn)."

In the vicinity of the bottom wall 34e of the processing tank 34, a plurality of (e.g., three) processing liquid ejection members 60 (processing liquid ejection units) connected to one end of the circulation channel 49 (see FIG. 2) and a connection member 63 are provided. A plurality of (e.g., two) of supply pipes 61 that are continuous from the circulation flow path 49 are arranged on the upstream side of the plurality of processing liquid ejection members 60. The supply pipes 61 are disposed between the support plate 71 and the side wall 34b and extend in the vertical direction. The processing liquid ejection members 60 are connected to the lower ends of the supply pipes 61 via a branching unit (not illustrated) that branches the processing liquid.

The processing liquid ejection members 60 eject the processing liquid into the processing tank 34. Each of the processing liquid ejection members 60 is a cylindrical member extending in the X-axis direction, and communicates with the branching unit at the end on the supply pipe 61 side and is closed at the end opposite to the supply pipe 61 side. The processing liquid ejection members 60 are arranged side by side at substantially the same interval in the Y-axis direction. The processing liquid ejection members 60 are arranged within the range of the lateral width of the substrate 8 (substrate W1) when viewed in the X-axis direction. In this example, the processing liquid ejection members 60 are arranged between the substrate support members 73a, 73c, between the substrate support members 73c, 73d, and the substrate support members 73d, 73b in the Y-axis direction.

The processing liquid ejection members 60 are disposed at substantially the same height positions below the plurality of (lower ends of) substrates 8. In the example illustrated in FIG. 5, the upper ends of the processing liquid ejection members 60 are lower than the upper ends (and the center in the height direction) of the substrate support members 73c, 73d. Each processing liquid ejection member 60 has a plurality of ejection holes (not illustrated). The ejection holes are distributed on the peripheral surface of each processing liquid ejection member 60. When the processing liquid is ejected into the storage space in the processing tank 34 through the ejection holes, the processing liquid ejection members 60 generate ascending flow Fu (see, e.g., FIG. 4) of the processing liquid. The ascending flow of the processing liquid is the flow of the processing liquid that flows from the bottom to the top in the vertical direction inside the processing liquid stored in the processing tank 34.

The connection member 63 physically connects the ends of the processing liquid ejection members 60. The connection member 63 is a rod-shaped member extending in the Y-axis direction, and are provided at the tip ends (the other end close to the side wall 34a) of the processing liquid ejection members 60. In the example illustrated in FIG. 4, the connection member 63 is disposed between the substrate W1 (first substrate) and the side wall 34a in the X-axis direction. In FIG. 5, the connection member 63 is not illustrated.

In the vicinity of the bottom wall 34e in the processing tank 34, a plurality of (e.g., six) gas ejection members 65 connected to one end of the supply path of the gas supply section 55 and a connection member 68 are provided. A plurality of (e.g., two) supply pipes 66 that are continuous from the supply path of the gas supply unit gas supply section are arranged on the upstream side of the gas ejection members 65. The supply pipes 66 are arranged between the support plate 71 and the side wall 34b so as not to interfere with the supply pipe 61 and extend in the vertical direction. The gas ejection members 65 are connected to the lower ends of the supply pipes 66 via a branching unit (not illustrated) that branches the processing liquid.

The gas ejection members 65 eject an inert gas into the processing tank 34 and promote the formation of ascending flow Fu of the processing liquid by bubbles formed of nitrogen gas. By supplying this nitrogen gas, the state of the ascending flow Fu is evenly maintained. Each of the gas ejection members 65 is a cylindrical member extending in the X-axis direction. Each gas ejection member 65 communicates with the branching unit at the end on the supply pipe 66 side, and is closed at the end opposite to the supply pipe 66 side. The gas ejection members 65 are arranged side by side in the Y-axis direction. The gas ejection members 65 are arranged within the range of the lateral width of the substrate 8 (substrate W1) when viewed in the X-axis direction. In the example illustrated in FIG. 5, two gas ejection members 65 are disposed, with one processing liquid ejection member 60 interposed therebetween, in each of a space between the substrate support members 73a, 73c, a space between the substrate support members 73c, 73d, and a space between the substrate support members 73d, 73b.

The plurality of gas ejection members 65 are disposed below the plurality of (centers of) processing liquid ejection members 60. Each gas ejection member 65 has a plurality of ejection holes (not illustrated). The ejection holes are distributed on the peripheral surface of each gas ejection member 65. By ejecting the inert gas into the processing tank 34 through the plurality of ejection holes, the formation of the ascending flow Fu of the processing liquid is promoted.

The connection member 68 physically connects the ends of the gas ejection members 65. The connection member 68 is a rod-shaped member extending in the Y-axis direction, and is provided at the tip ends (the other ends close to the side wall 34a) of the gas ejection members 65. In the example illustrated in FIG. 4, the connection member 68 is disposed between the substrate W1 and the side wall 34a. The connection member 68 is disposed at substantially the same position as the connection member 63 in the X-axis direction, and is disposed below the connection member 63. Meanwhile, in FIG. 5, the connection member 68 is not illustrated.

The plurality of substrates 8 supported by the substrate support members 73a to 73d in the processing tank 34 are arranged at substantially equal intervals in the X-axis direction. As an example, the distance D1 between the substrate W1 and the substrate W2 is about 4 mm to 6 mm. The distance D1 is the shortest distance between the main surface Wb of the substrate W1 and the main surface Wa of the substrate W2. The distance D2 between the substrate W1 and the side wall 34a is about 3 to 5 times the distance D1. As an example, the distance D2 is about 12 mm to 30 mm. The distance D2 is the shortest distance between the main surface Wa of the substrate W1 and the inner surface of the side wall 34a. The distance between the substrate WN and the guide plate 72 is about 2 to 3 times the distance D1. As an example, the distance between the substrate WN and the guide plate 72 is about 8 mm to 18 mm.

When performing the liquid processing on the substrates 8, in the processing liquid storage section 38 of the etching apparatus 26, the processing liquid flowing in the circulation flow path 49 is supplied into the processing tank 34 from the ejection holes formed in the processing liquid ejection members 60 via the supply pipe 61. The processing liquid ejected from the processing liquid discharge members 60 flows between the plurality of substrates 8 as the ascending flow Fu. In addition, by the processing liquid ejected from the processing liquid ejection members 60, the ascending flow is also formed in each of the side space Va between the substrate W1 and the side wall 34a and the side space Vb between the substrate WN and the guide plate 72. Furthermore, by the processing liquid ejected from the processing liquid ejection members 60, the ascending flow Fu is also formed in each of the side space Vc between the plurality of substrates 8 (the substrate support member 73a) and the side wall 34c and the side space Vd between the plurality of substrates 8 (the substrate support member 73b) and the side wall 34d.

The processing liquid that has moved upward in the processing tank 34 as the ascending flow Fu and has reached the vicinity of the upper end flows over the side walls 34a to 34d of the processing tank 34 and flows into the storage space in the outer tank 42 as flow Fo (overflows to the outer tank 42). The processing liquid in the storage space in the outer tank 42 is supplied again into the processing tank 34 via the circulation flow path 49. Thereafter, the ejection of the processing liquid into the processing tank 34, the formation of the ascending flow, the overflow to the outer tank 42, and the supply into the processing tank 34 via the circulation flow path 49 are repeated. At this time, the controller 7 may control the processing liquid circulation section 40 (the pump 50) and the processing liquid discharge section 41 (the valve 41B) such that the liquid level of the processing liquid in the storage space in the outer tank 42 is maintained within a predetermined range. By immersing the plurality of substrates 8 in the processing tank 34 in which the circulation of the processing liquid is repeated for a predetermined time, a liquid processing is performed on at least one of the main surface Wa and the main surface Wb of each substrate 8. In this etching, the etching amount on the main surfaces Wa, Wb may change depending on the strength or direction of the ascending flow Fu flowing along the main surfaces Wa, Wb.

Here, the etching apparatus 26 includes a rectifying section 98 and a rectifying section 99 (a second rectifying section) that adjust the flow of the processing liquid. The rectifying section 98 adjusts the flow of the processing liquid in the side spaces Va, Vb. Specifically, the rectifying section 98 adjusts the flow of the processing liquid in the side spaces Va, Vb so as to suppress the influence on the liquid processing due to descending flow to be described later. The rectifying section 98 includes a plurality of (e.g., 11) of discharge holes 75a (first discharge holes), a plurality of (e.g., 11) discharge holes 75b, and a plurality of (e.g., 11) discharge holes 75c.

The discharge holes 75a have a function of discharging the processing liquid in the processing tank 34. The discharge holes 75a are provided in the side wall 34a and each penetrate the side wall 34a in the X-axis direction. Therefore, the discharge holes 75a connect the storage space (the side space Va) in the processing tank 34 and the storage space in the outer tank 42 to each other. When viewed in the X-axis direction, the shape (contour) of each discharge hole 75a may be rectangular, circular, or elliptical. Alternatively, each discharge hole 75a may have a slit shape extending in either the Y-axis direction or the Z-axis direction.

The discharge holes 75a are arranged to face the upper end of the substrate 8 (substrate W1). Here, the wording "the discharge holes 75a faces the upper end of the substrate W1" means that at least some of the discharge holes 75a are located within a range from the upper end of the substrate W1 (the highest point of the substrate W1) to a height of ¾ of the substrate W1. As illustrated in FIG. 5, the discharge holes 75a may be disposed in the vicinity of the upper side in the upper end portion of the substrate W1. For example, at least some of the discharge holes 75a may be located within a range from the upper end of the substrate W1 to a height of ⅞ of the substrate W1. Alternatively, the discharge holes 75a may be arranged to face the upper end of the substrate W1. In this case, at least some of the discharge holes 75a only needs to be arranged at a height position substantially equal to the upper end of the substrate W1.

The discharge holes 75a are arranged side by side in the horizontal direction (Y-axis direction). For example, the discharge holes 75a are arranged such that the intervals between the adjacent discharge holes 75a are substantially equal in the Y-axis direction. In the example illustrated in FIG. 5, the discharge holes 75a are arranged in a line within a range substantially equal to the lateral width of the substrate W1. In addition, the discharge holes 75a are disposed in the central area in the lateral direction (Y-axis direction) of the substrate W1, and may not be disposed outside the central area. The central area in the lateral direction of the substrate W1 is, for example, an area including an area of ⅓ of the lateral width of the substrate W1. In the side space Va, the discharge holes 75a formed as described above discharge the processing liquid stored in the processing tank 34 to the storage space in the outer tank 42.

The plurality of discharge holes 75b and the plurality of discharge holes 75c have a function of discharging the processing liquid in the processing tank 34. The discharge holes 75b are provided in the side wall 34b, and each penetrate the side wall 34b in the X-axis direction. The discharge holes 75c are provided in the support plate 71 and the guide plate 72. The plurality of discharge holes 75c penetrate the support plate 71 and the guide plate 72 in the X-axis direction. In addition, FIG. 4 illustrates one of the discharge holes 75b and one of the discharge holes 75c, and FIG. 5 does not illustrate the discharge holes 75b, 75c. The discharge holes 75b and the discharge holes 75c are arranged at positions corresponding to each other when viewed in the X-axis direction. Specifically, when viewed in the X-axis direction, at least some of the discharge holes 75b overlap the discharge holes 75c, respectively.

The discharge holes 75b, 75c are arranged so as to correspond to the discharge holes 75a. The positional relationship of the discharge holes 75b, 75c with respect to the substrate WN in the height direction is the same as the positional relationship of the discharge holes 75a with respect to the substrate W1. The discharge holes 75b, 75c are arranged side by side in the horizontal direction (Y-axis direction). For example, the discharge holes 75b, 75c are arranged such that the intervals between adjacent discharge holes 75b, 75c are substantially equal in the Y-axis direction. The positional relationship of the discharge holes 75b, 75c with respect to the substrate WN in the Y-axis direction is the same as the positional relationship of the discharge holes 75a with respect to the substrate W1. In the side space Vb, the discharge holes 75b, 75c formed as described above discharge the processing liquid stored in the processing tank 34 to the storage space in the outer tank 42.

The rectifying section 99 adjusts the flow of the processing liquid in the side spaces Vc, Vd. Specifically, the rectifying section 99 adjusts the flow of the processing liquid so as to suppress the influence of descending flow on the liquid processing in the side spaces Vc, Vd. The rectifying section 99 includes a plurality of (e.g., nine) discharge holes 76a (second discharge holes) and a plurality of (e.g., nine) discharge holes 76b (second discharge holes).

The discharge holes 76a, 76b each have a function of discharging the processing liquid in the processing tank 34. The discharge holes 76a, 76b are provided in respective side walls 34c, 34d connected to the side wall 34a. The discharge holes 76a, 76b penetrate the side walls 34c, 34d in the Y-axis direction. In FIG. 4, the discharge holes 76a are not illustrated, and in FIG. 5, one of the discharge holes 76a and one of the discharge holes 76b are illustrated. The discharge holes 76a, 76b are arranged at height positions corresponding to the discharge holes 75a. The plurality of discharge holes 76a, 76b are arranged side by side in the X-axis direction. For example, the plurality of discharge holes 76a, 76b are arranged such that the intervals between adjacent discharge holes 76a, 76b are substantially equal in the X-axis direction. The discharge holes 76a, 76b are arranged side by side in a range from a position closer to the side wall 34a than the substrate W1 to a position closer to the side wall 34b than the substrate WN in the X-axis direction. The arrangement positions of the discharge holes 76a correspond to the arrangement positions of the discharge holes 76b. In other words, when viewed in the Y-axis direction, the discharge holes 76a overlap the discharge holes 76b. In the side spaces Vc and Vd, the discharge holes 76a, 76b formed as described above discharge the processing liquid stored in the processing tank 34 to the storage space in the outer tank 42.

The height position of the plurality of discharge holes 75a, 75b, 75c and the plurality of discharge holes 76a, 76b (hereinafter, referred to as "discharge hole height") is higher than the liquid level of the processing liquid stored in the outer tank 42. Specifically, the discharge hole height may be higher than the liquid level of the processing liquid in the outer tank 42, which is maintained at a predetermined height position by the controller 7. Since the discharge hole height is higher than the liquid level of the processing liquid in the outer tank 42, the processing liquid in the processing tank 34 is easily discharged to the storage space in the outer tank 42 through the discharge holes.

[Action]

The etching apparatus 26 described in the above embodiment includes a rectifying section 98 that adjusts the flow of the processing liquid in the side space Va. If the ascending flow flowing along the main surface Wa of the substrate W1 facing the side wall 34a is disturbed, the processing on the main surface Wa of the substrate W1 may be nonuniform. In the above configuration, the flow of the processing liquid is adjusted in the side space Va by the rectifying section 98, and thus the disturbance of the ascending flow flowing along the main surface Wa of the substrate W1 is suppressed. For this reason, since the influence on the substrate liquid processing due to the disturbance of the ascending flow is reduced, it is possible to improve the in-plane uniformity in processing a substrate.

In the processing tank 34, the ascending flow Fu is formed by the processing liquid ejection member 60 as described above while the liquid processing on the substrate 8 is performed. At this time, most of the processing liquid overflows from the processing tank 34 to the outer tank 42, but part of the processing liquid may form flow circulating in the processing tank 34. Specifically, the flow of the processing liquid circulating in the processing tank 34 may be formed by forming descending flow Fd in the side space Va in the processing tank 34. It is believed that since ascending flow Fu is formed between the plurality of substrates 8 in the processing tank 34, when descending flow Fd is formed in the space between the substrate 8 and the side walls 34a to 34d of the processing tank 34 when the descending flow Fd is formed. In particular, since the side space Va between the main surface Wa of the substrate W1 and the side wall 34a often has the distance D2 larger than the distance D1 between the substrates 8, the descending flow Fd is likely to be formed. When the descending flow Fd is formed, the ascending flow Fu of the processing liquid is disturbed. The disturbance of the ascending flow Fu affects the etching processing in the substrate 8. As described above, in the etching processing, the etching amount may be changed according to the strength or direction of the ascending flow Fu flowing along the main surface of the substrate 8. Therefore, when the descending flow Fd is formed in the vicinity of the main surface of the substrate 8, the ascending flow Fu may be disturbed, affecting the etching processing on the main surface of the substrate 8, and the in-plan uniformity in liquid processing a substrate.

In contrast, the etching apparatus 26 is provided with a rectifying section 98 configured to adjust the flow of the processing liquid in the side space Va. For this reason, the rectifying section 98 suppresses the disturbance of the ascending flow Fu of the processing liquid in the side space Va. Therefore, the disturbance of the ascending flow Fu flowing along the main surface Wa of the substrate W1 disposed in the vicinity of the side space Va is suppressed. Thus, it is possible to improve the in-plane uniformity in liquid processing a substrate.

In the etching apparatus 26, the rectifying section 98 has a discharge hole 75a provided in the side wall 34a and configured to discharge the processing liquid in the processing tank 34. In this case, since the discharge hole 75a is provided in the side wall 34a, the processing liquid that has risen to the vicinity of the upper end of the processing tank 34 is discharged to the outside of the processing tank 34 (the storage space in the outer tank 42) through the discharge hole 75a. For this reason, since it becomes possible to prevent formation of the descending flow Fd in the side space Va, the disturbance of the ascending flow Fu caused by the descending flow Fd and flowing along the main surface Wa of the substrate W1 is suppressed. As a result, it is possible to improve the in-plane uniformity in liquid processing a substrate.

In the etching apparatus 26, the discharge hole 75a is provided to face the upper end portion of the substrate W1. In this case, by the discharge hole 75a, it is possible to more effectively suppress the descending flow Fd from being formed along the main surface Wa of the substrate W1. In addition, when the discharge hole 75a is provided to face the upper end portion of the substrate W1, it is possible to suppress the disturbance of the ascending flow Fu in the side space Va by the discharge hole 75a. Depending on the height position where the discharge hole 75a is provided, the ascending flow Fu in the side space Va may be affected by the discharge of the processing liquid from the discharge hole 75a. However, when the discharge hole 75a faces the upper end portion of the substrate W1, it is possible to suppress the disturbance of the ascending flow Fu in the side space Va.

The etching apparatus 26 further includes a rectifying section 99 having discharge holes 76a, 76b provided in the side walls 34b, 34d connected to the side wall 34a of the processing tank 34 and configured to discharge the processing liquid in the processing tank 34. In this case, the discharge of the processing liquid through the discharge holes 76a, 76b prevents the formation of the descending flow Fd in the side spaces Vc, Vd between the side walls 34c, 34d and the peripheral surface of the substrate W1. Therefore, since the ascending flow Fu flowing along the main surface Wa of the substrate W1 is prevented from being disturbed by the influence of the descending flow Fd formed in the side spaces Vc and Vd, it is possible to further improve the in-plane uniformity in liquid processing a substrate.

The plurality of discharge holes 75a, 75b, 75c are not limited to the above-described configuration. The discharge holes 75a, 75b, 75c may have any configuration as long as the processing liquid in the processing tank 34 can be discharged to the storage space in the outer tank 42 therethrough. The rectifying section 98 may have one slit-shaped discharge hole formed so as to extend in the horizontal direction (Y-axis direction) instead of the plurality of discharge holes 75a. The rectifying section 98 may have one slit-shaped discharge hole formed so as to extend in the horizontal direction (Y-axis direction) instead of the discharge holes 75b, 75c. The number of the discharge holes 75a and the number of the discharge holes 75b (discharge holes 75c) may be different from each other. The arrangement positions of the discharge holes 75a and the arrangement positions of the discharge holes 75b may be different from each other (not necessarily overlapping each other when viewed in the X-axis direction).

The height positions of the discharge holes 75a, 75b, 75c may be different from each other. For example, when viewed in the X-axis direction, the discharge holes 75a, 75b, 75c may be arranged along the peripheral edge of the upper end portion of the substrate W1 or the substrate WN. The discharge holes 75a, 75b, 75c may be arranged such that intervals between adjacent discharge holes 75a, 75b, 75c are different in the Y-axis direction. The discharge holes 75a, 75b, 75c may be different from each other in at least one of shape (contour) and size. Each of the discharge holes 75a, 75b, 75c may face an area other than the upper end portion of the substrate W1 or the substrate WN. For example, each of the discharge holes 75a, 75b, 75c may face the central area in the height direction of the substrate W1 or the substrate WN.

The discharge holes 76a, 76b may have any configuration as long as the processing liquid in the processing tank 34 can be discharged into the storage space in the outer tank 42 therethrough. The rectifying section 99 may have one slit-shaped discharge hole formed so as to extend in the X-axis direction instead of the discharge holes 75b, 76b. The number of the discharge holes 76a and the number of the discharge holes 76b may be different from each other. The arrangement positions of the discharge holes 76a and the arrangement positions of the discharge holes 76b may be different from each other (not necessarily overlapping each other when viewed in the Y-axis direction).

The height positions of the discharge holes 76a and the discharge holes 76b may be different from each other. The discharge holes 76a, 76b may be arranged such that intervals between adjacent discharge holes 76a, 76b are different in the X-axis direction. The discharge holes 76a, 76b may be different from each other in at least one of shape (contour) and size. The discharge holes 76a, 76b may be disposed at the height position of the central area of the substrate 8 in the height direction, or may be disposed at the height position of the lower end portion of the substrate W1. The height positions of the discharge holes 75a, 75b, 75c may be different from the height positions of the discharge holes 76a, 76b.

In the above-described embodiment, the case where a plurality of discharge holes 75a, 75b, 75c, 76a, 76b are provided has been described. However, it is sufficient if a plurality of discharge holes 75a are be provided at least in the side wall 34a as the rectifying section 98. By providing the plurality of discharge holes 75a in the side wall 34a, it is possible to suppress at least the disturbance of the ascending flow Fu in the side space Va and it is possible to prevent the etching processing on the main surface Wa of the substrate W1 from being affected by the disturbance of the ascending flow Fu.

Second Embodiment

Next, a substrate liquid processing system according to a second embodiment will be described with reference to FIGS. 6 to 8. An etching apparatus 26A included in the substrate liquid processing system according to the second embodiment is different from the etching apparatus 26 described in the first embodiment in the structure of rectifying sections. The rectifying section 98A in the etching apparatus 26A includes a plate-shaped member 81 and a plurality of fixing members 82 instead of the plurality of discharge holes 75a, 75b, 75c. In addition, the rectifying section 99A in the etching apparatus 26A includes plate-shaped members 83a, 83b and a plurality of fixing members 84a, 84b instead of the plurality of discharge holes 76a, 76b.

Figure 6:
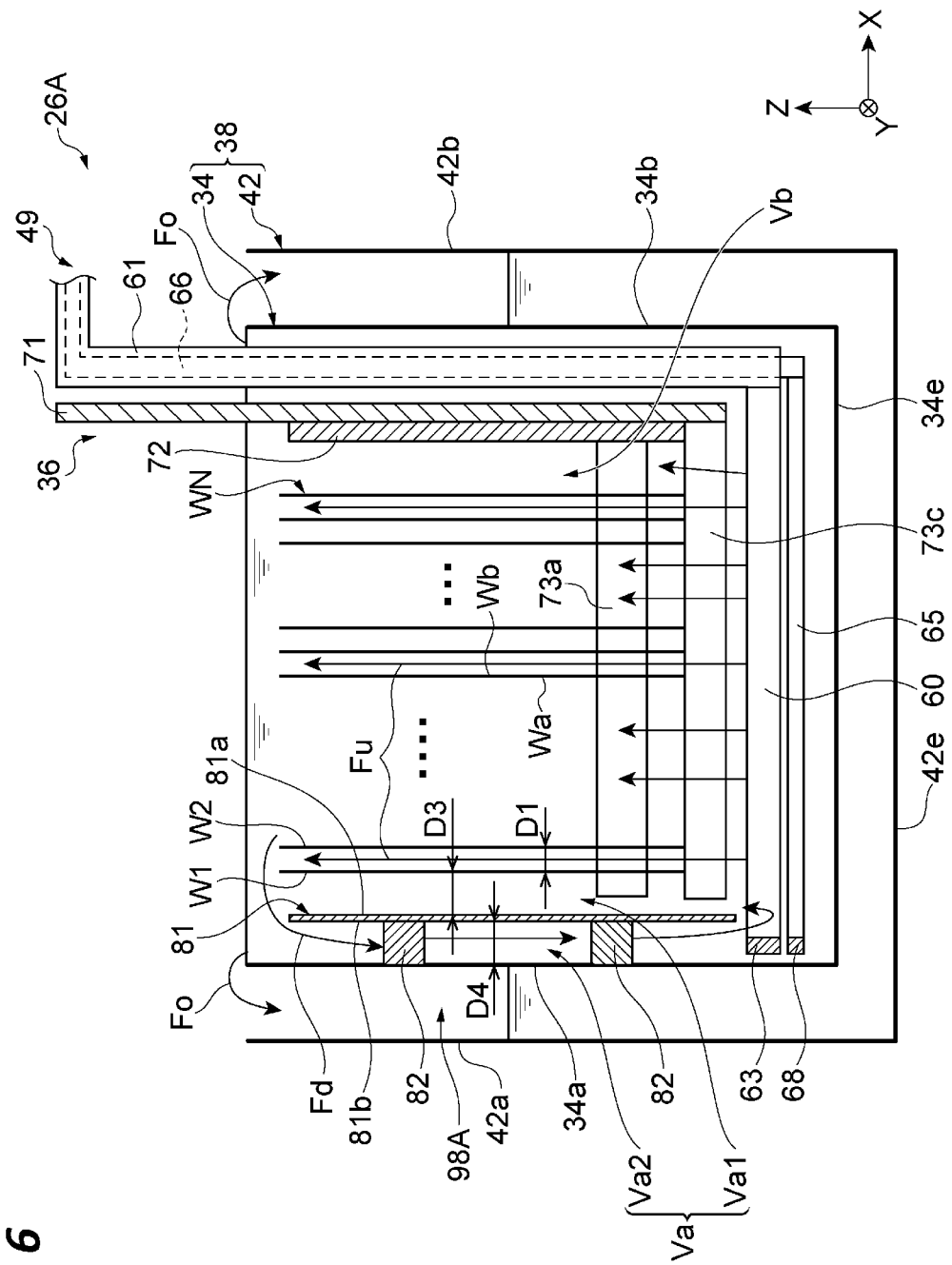
FIG. 6 is a schematic side view illustrating the configuration of a substrate liquid processing system according to a second embodiment.
Figure 7:
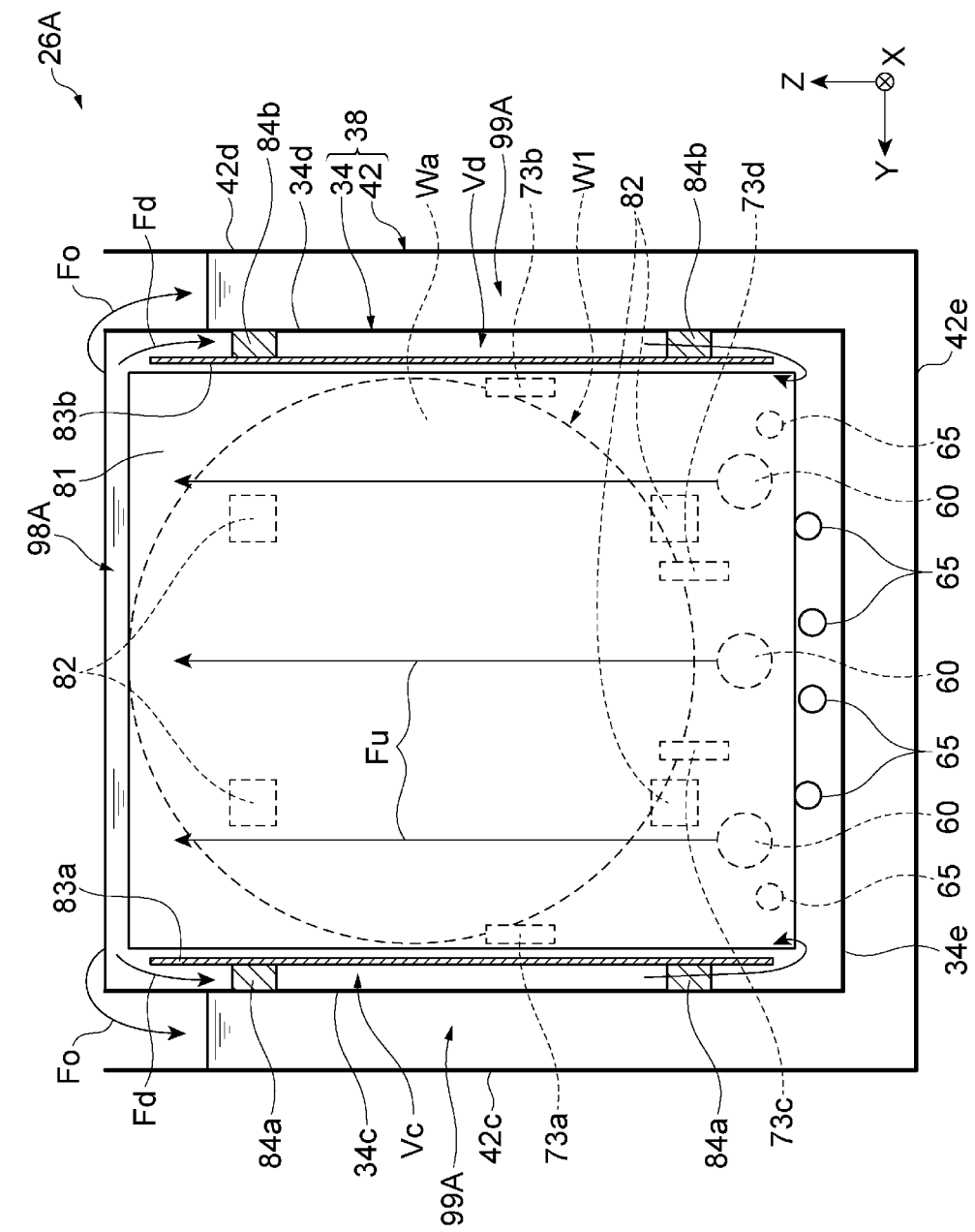
FIG. 7 is a schematic front view illustrating the configuration of a substrate liquid processing apparatus.
Figure 8:
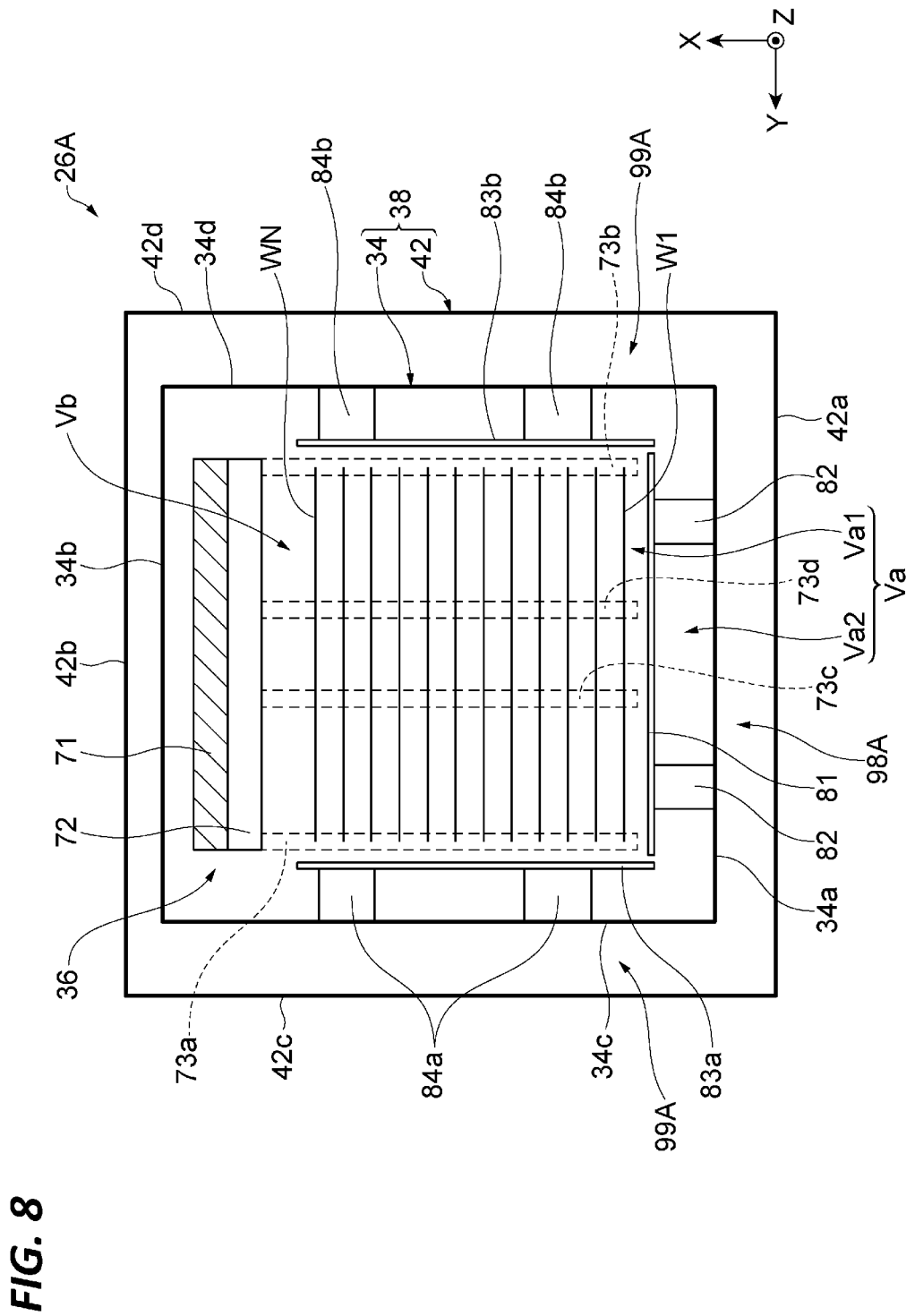
FIG. 8 is a schematic plan view illustrating the configuration of the substrate liquid processing apparatus.

As illustrated in FIGS. 6 and 7, the plate-shaped member 81 as the rectifying section 98A provided in the side space Va divides the side space Va into two areas. The plate-shaped member 81 has a plate shape, and its main surface extends along the YZ plane. In other words, the pair of main surfaces of the plate-shape member 81 are substantially parallel to the main surfaces Wa and Wb of the substrate 8, respectively, and substantially parallel to the side wall 34a. The plate-shaped member 81 is disposed between the substrate W1 and the side wall 34a so as to face the substrate W1 and the side wall 34a, respectively. In the example shown in FIGS. 6 and 7, the plate-shaped member 81 covers the entire area of the substrate W1 when viewed in the X-axis direction. That is, when viewed in the X-axis direction, the size (area) of the plate-shaped member 81 is larger than the size of the substrate W1. That is, the horizontal width (the length in the Y-axis direction) of the plate-shaped member 81 is longer than the horizontal width of the substrate W1, and the vertical width (the length in the Z-axis direction) of the plate-shaped member 81 is larger than the vertical width of the substrate W1. The lower end of the plate-shaped member 81 is lower than the lower end of the substrate W1. FIG. 7 illustrates the state in which the lower end of the plate-shaped member 81 is lower than the processing liquid discharge member 60, but the position of the lower end of the plate-shaped member 81 may be changed as appropriate. In addition, since the substrate W1 is disposed in the side space Va, the substrate W1 and the side wall 34a face each other across the plate-shaped member 81.

In the X-axis direction, the plate-shaped member 81 is spaced apart from the substrate W1 and the side wall 34a. The plate-shaped member 81 has a facing surface 81a facing the substrate W1 and a connection surface 81b opposite to the facing surface 81a. That is, the facing surface 81a corresponds to one main surface of the plate-shaped member 81, and the connection surface 81b corresponds to the other main surface of the plate-shaped member 81. The distance D3 between the plate-shaped member 81 and the substrate W1 may substantially coincide with the distance D4 between the plate-shaped member 81 and the side wall 34a, or may be smaller than the distance D4. The distance D3 is the shortest distance between the facing surface 81a and the main surface Wa of the substrate W1. The distance D4 is the shortest distance between the connection surface 81b and the inner surface of the side wall 34a. The distance D3 may substantially coincide with the distance D1, or may be smaller than the distance D1. The relationship between the distance D3 and the distance D4 and the relationship between the distance D3 and the distance D1 are not limited to those described above.

A plurality of (e.g., four) fixing members 82 (fixing units) fix the plate-shaped member 81 to the processing tank 34 (the side wall 34a). The plurality of fixing members 82 have, for example, a rectangular parallelepiped shape. One end of each fixing member 82 is connected to the side wall 34a, and the other end of the fixing member 82 is connected to the plate-shaped member 81 (connection surface 81b), so that the plate-shaped member 81 is connected (fixed) to the processing tank 34 via the plurality of fixing members 82.

The fixing members 82 may have any size and shape and may be arranged in any manner as long as the fixing members 82 does not significantly inhibit the flow of the processing liquid in the side space Va.

Since the plate-shaped member 81 is disposed between the substrate W1 and the side wall 34a, the side space Va is partitioned into two spaces. Specifically, the plate-shaped member 81 divides the side space Va into two spaces (a space Va1 and a space Va2). The space Va1 is a space between the substrate W1 and the plate-shaped member 81, and the space Va2 is a space between the side wall 34a and the plate-shaped member 81. The space Va1 and the space Va2 extend in the vertical direction. The magnitude relationship between the sizes (volumes) of the space Va1 and the space Va2 depends on the magnitude relationship between the distance D3 and the distance D4, and the size of the space Va1 may substantially coincide with the size of the space Va2 or may be smaller than the space Va2.

As illustrated in FIG. 7, a plate-shaped member 83a as the rectifying section 99A and a plurality of (e.g., four) fixing members 84a are arranged in the side space Vc, and a plate-shaped member 83b as the rectifying section 99A and a plurality of fixing members 84b are arranged. The plate-shaped members 83a, 83b are configured in the same manner as the plate-shaped member 81, and cover a plurality of substrates 8 (substrates W1 to WN) when viewed in the Y-axis direction. The plate-shaped member 83a is spaced apart from the peripheral surfaces of the substrates 8 (Wn) and the side wall 34c. The plate-shaped member 83b is spaced apart from the peripheral surfaces of the substrates 8 (Wn) and the side wall 34d. As a result, the plate-shaped members 83a, 83d partition respective side spaces Vc, Vd into two spaces. Specifically, the plate-shaped member 83a divides the side space Vc into two spaces (a space between the peripheral surfaces of the substrates 8 and the plate-shaped member 83a and a space between the plate-shaped member 83a and the side wall 34c). Similarly, the plate-shaped member 83b divides the side space Vd into two spaces (a space between the peripheral surfaces of the substrates 8 and the plate-shaped member 83b and a space between the plate-shaped member 83b and the side wall 34d). The fixing members 84a, 84b are also configured similarly to the fixing members 82, and fix the plate-shaped members 83a, 83b to the side walls 34c, 34d (the processing tank 34). In other words, the plate-shaped members 83a, 83b are fixed to the processing tank 34 via the fixing members 84a, 84b.

In the etching apparatus 26A according to the second embodiment, the rectifying section 98A includes a plate-shaped member 81 disposed in the side space Va. The plate-shaped member 81 is spaced apart from the substrate W1 and is also spaced apart from the side wall 34a. One main surface of the plate-shaped member 81 is a facing surface 81a that faces the substrate W1. In this configuration, a part of the processing liquid rising to the vicinity of the upper end of the processing tank 34 may form descending flow Fd in the space Va2 between the plate-shaped member 81 and the side wall 34a in the side space Va. That is, the space Va2 is a space where the descending flow Fd may be formed. By forming such the space Va2, it is possible to suppress the descending flow Fd from being formed in a space different from the space Va2. Therefore, it is possible to suppress the descending flow Fd from being formed along the main surface Wa of the substrate W1 disposed in the space Va1, and thus the disturbance of the ascending flow Fu along the main surface Wa of the substrate W1 is suppressed.

As a result, it is possible to improve the in-plane uniformity in liquid processing a substrate.

In the etching apparatus 26A, the distance D3 between the substrate W1 and the plate-shaped member 81 is smaller than the distance D4 between the plate-shaped member 81 and the side wall 34a. In this case, the descending flow Fd is more easily formed in the space Va2 between the plate-shaped member 81 and the side wall 34a than in the space Va1 between the substrate W1 and the plate-shaped member 81. For this reason, it is possible to further suppress the disturbance of the ascending flow Fu flowing along the main surface Wa of the substrate W1, and thus it is possible to more reliably achieve the in-plane uniformity in liquid processing a substrate.

In the etching apparatus 26A, the rectifying section 98A has fixing members 82 that fix the plate-shaped member 81 to the processing tank 34. In this case, since the plate-shaped member 81 is fixed to the processing tank 34 by the fixing members 82, for example, when the substrate support members 73a to 73d are moved out of the processing tank 34 so as to deliver the plurality of substrates 8, the plate-shaped member 81 does not affect the delivery of the substrates 8. As a result, it is possible to achieve both the easy delivery of the substrates to the substrate support members 73a to 73d and the improvement of the in-plane uniformity in processing a substrate.

The plate-shaped member 81 is not limited to the above-described configuration. The plate-shaped member 81 does not have to be provided at a position overlapping the entire area of the substrate W1 when viewed in a direction orthogonal to the main surface (the facing surface 81a) thereof. For example, the plate-shaped member 81 may be provided at a position overlapping a portion of the substrate W1. In addition, for example, the plate-shaped member 81 having a width of about ⅓ of the lateral width of the substrate W1 may be provided so as to overlap a portion of the substrate W1 when viewed in a direction orthogonal to the main surface (the facing surface 81a) thereof. Alternatively, the plate-shaped member 81 having about ⅓ of the vertical width of the substrate W1 may be provided so as to overlap the upper end portion of the substrate W1. The plate-shaped member 81 may have a shape corresponding to the substrate W1 when viewed in a direction orthogonal to the main surface (the facing surface 81a) thereof. Alternatively, when the plate-shaped member 81 covers the upper end portion of the substrate W1, the plate-shaped member 81 may have a shape corresponding to the upper end portion of the substrate W1.

As described above, the shape of the plate-shaped member 81 may be appropriately changed. However, from the viewpoint of promoting the formation of the descending flow Fd in the space Va2, it is conceivable to increase the area where the plate-shaped member 81 and the substrate W1 overlap when viewed in a direction orthogonal to the main surface (the facing surface 81a) thereof and to increase the area occupied by the plate-shaped member 81. With such a configuration, it is believed that it is possible to more clearly partition the space Va1 and the space Va2, and it is possible to promote the formation of the descending flow Fd in the space Va2. In addition, the plate-shaped member 81 may be fixed to a portion other than the side wall 34a of the processing tank 34 (e.g., the bottom wall 34e) via the fixing members 82.

Figure 9:
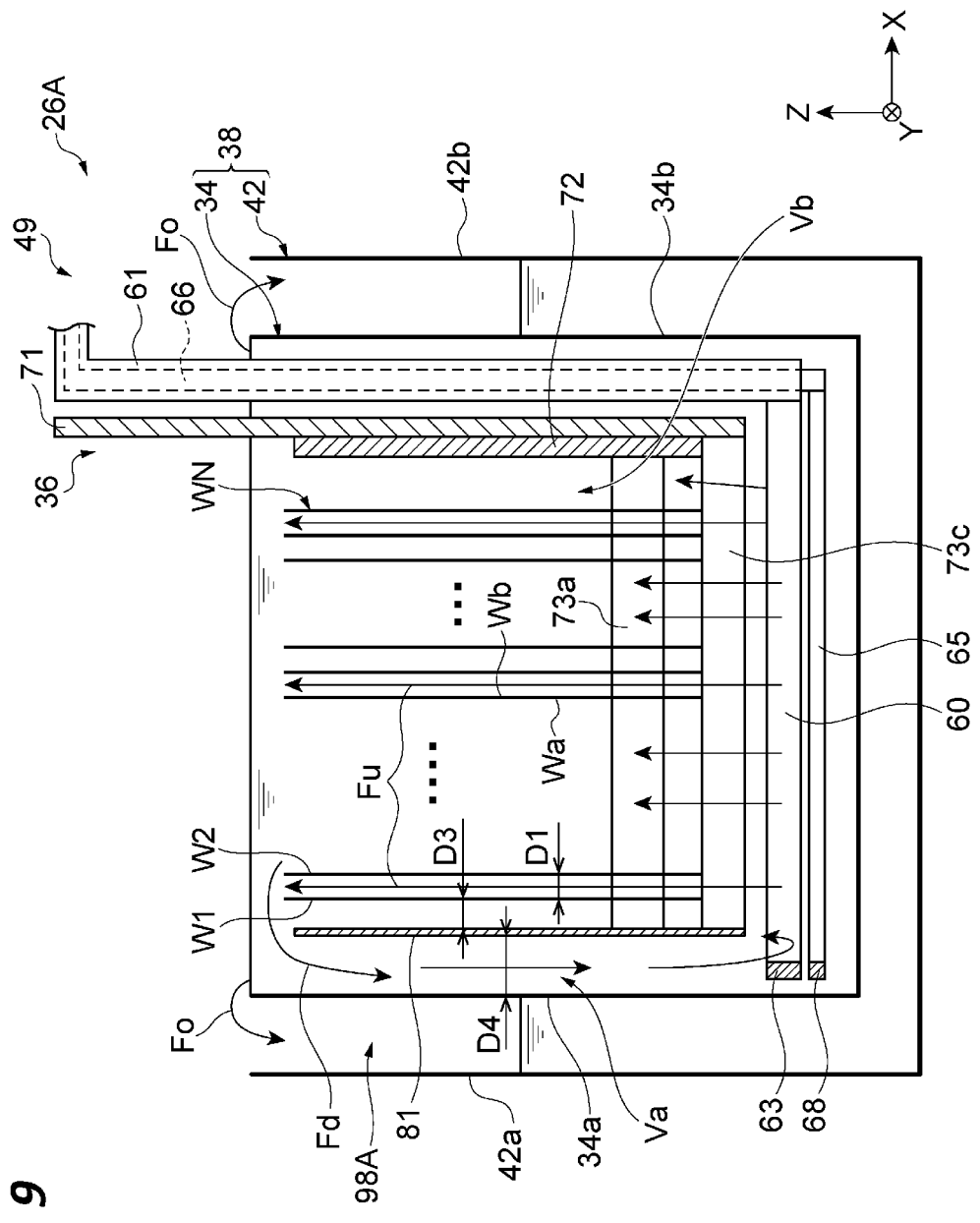
FIG. 9 is a schematic side view illustrating another example of the configuration of the substrate liquid processing apparatus.

The plate-shaped member 81 may be fixed to a member different from the processing tank 34. FIG. 9 illustrates the configuration of the etching apparatus 26A when the plate-shaped member 81 is provided on the substrate support members 73a to 73d of the substrate lifting mechanism 36. As illustrated in FIG. 9, the plate-shaped member 81 may be fixed to the tip end portions of the substrate support members 73a to 73d (the end portions opposite to the end portions fixed to the support plate 71). For example, the substrate support members 73a to 73d may have support grooves for supporting the plate-shaped member 81. Even in this case, the distance D3 between the substrate W1 and the plate-shaped member 81 may substantially coincide with the distance D4 between the plate-shaped member 81 and the side wall 34a, or may be smaller than the distance D4. Thus, even when the plate-shaped member 81 is fixed to the substrate lifting mechanism 36 instead of the processing tank 34, the side space Va is divided into a space between the substrate W1 and the plate-shaped member 81 and a space between the plate-shaped member 81 and the side wall 34a by the plate-shaped member 81. In addition, by dividing the side space Va into two spaces by the plate-shaped member 81, it is possible to prevent the ascending flow Fu from being disturbed in a space other than the space where the descending flow Fd is capable of being formed.

In the etching apparatus 26A illustrated in FIG. 9, the substrate support members 73a to 73d extend in the vertical direction and the direction intersecting the main surface Wa of the substrate W1. In particular, the substrate support members 73a to 73d extend in the vertical direction and a direction orthogonal to the main surface Wa of the substrate W1 (X-axis direction). In addition, the plate-shaped member 81 is provided at a tip end portions of the substrate support members 73a to 73d where the substrate W1 is disposed. In this case, the plate-shaped member 81 may be brought closer to the substrate W1 compared with the case where the plate-shaped member 81 is fixed to the processing tank 34. For this reason, the space between the plate-shaped member 81 and the substrate W1 is reduced, and the descending flow Fd flows more reliably between the plate-shaped member 81 and the side wall 34a. As a result, the descending flow Fd is more reliably suppressed from being formed along the main surface Wa of the substrate W1, and thus it is possible to more reliably improve the in-plane uniformity in liquid processing a substrate.

Figure 10:
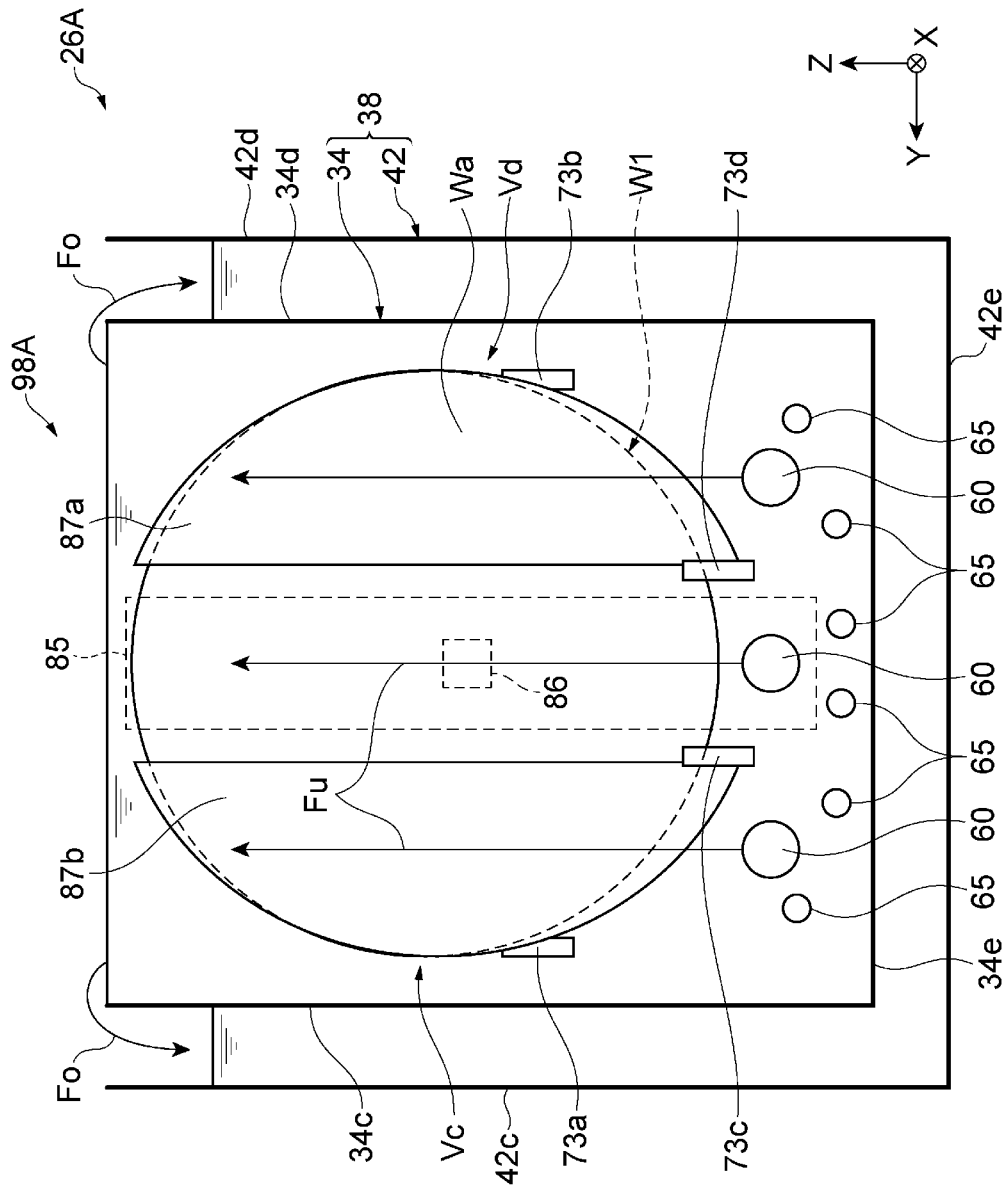
FIG. 10 is a schematic front view illustrating still another example of the configuration of the substrate liquid processing apparatus.

The plate-shaped member 81 may be configured with a plurality of separated plate-shaped members (partition members). FIG. 10 illustrates the configuration of the etching apparatus 26A in the case where plate-shaped members as the rectifying section 98A disposed in the side space Va are provided in the substrate support members 73a to 73d and the processing tank 34, respectively. In the example illustrated in FIG. 10, as a member corresponding to the plate-shaped member 81, a plate-shaped member is configured by a partition member 85 (first partition member) and partition members 87a, 87b (second partition members). The partition member 85 is fixed to the processing tank 34 (the side wall 34a) via a fixing member 86 (fixing unit), and is disposed so as to face a central area of the substrate W1 in the lateral direction (Y-axis direction). The partition member 87b is fixed to the tip end portions of the substrate support members 73a, 73c, and the partition member 87a is fixed to the tip end portions of the substrate support members 73b, 73d. The partition members 87a, 87b are arranged so as to face respective lateral areas of the central area of the substrate W1 in the lateral direction. When viewed in a direction orthogonal to the main surface of the partition member 85 (X-axis direction), the partition member 85 does not overlap both the partition members 87a, 87b. In other words, the partition member 85 constitutes a portion of the facing surface of the plate-shaped member disposed in the side space Va, and the partition members 87a, 87b constitute other portions of the facing surface.

In the etching apparatus 26A illustrated in FIG. 10, the substrate support members 73a to 73d extend in a direction orthogonal to both the vertical direction and the main surface Wa of the substrate W1 (X-axis direction). The rectifying section 98A includes a fixing member 86 for connecting the plate-shaped member to the processing tank 34. The plate-shaped member includes a partition member 85 connected to the processing tank 34 via the fixing member 86, and partition members 87a, 87b provided at the ends of the substrate support members 73a to 73d where the substrate W1 is disposed. The partition member 85 constitutes a portion of the facing surface of the plate-shaped member, which faces the substrate W1. The partition members 87a, 87b constitute other portions of the facing surface. By having such a configuration, for example, when the substrate support members 73a to 73d are moved out of the processing tank 34 and a plurality of substrates 8 are delivered, it is possible to prevent the plate-shaped member from interfering with the delivery operation. Specifically, compared with the configuration illustrated in FIG. 9, at least the space for the partition member 85 is generated at the tip end portions of the substrate support members 73a to 73d. For this reason, since it is possible to deliver a plurality of substrates 8 to the space using a member used for delivering the substrates 8, the plate-shaped member hardly affects the delivery of the substrates 8. As a result, it is possible to achieve both the easy delivery of substrates and the improvement of the in-plane uniformity in processing the substrates.

Third Embodiment

Next, a substrate liquid processing system according to a third embodiment will be described with reference to FIGS. 11 and 12. In the etching apparatus 26B provided in the substrate liquid processing system according to the third embodiment differs from the etching apparatus 26 in that the rectifying section 98B includes a protruding member 91 and a protruding member 92 instead of the plurality of discharge holes 75a, 75b, 75c and in that the rectifying section 99B is not provided.

Figure 11:
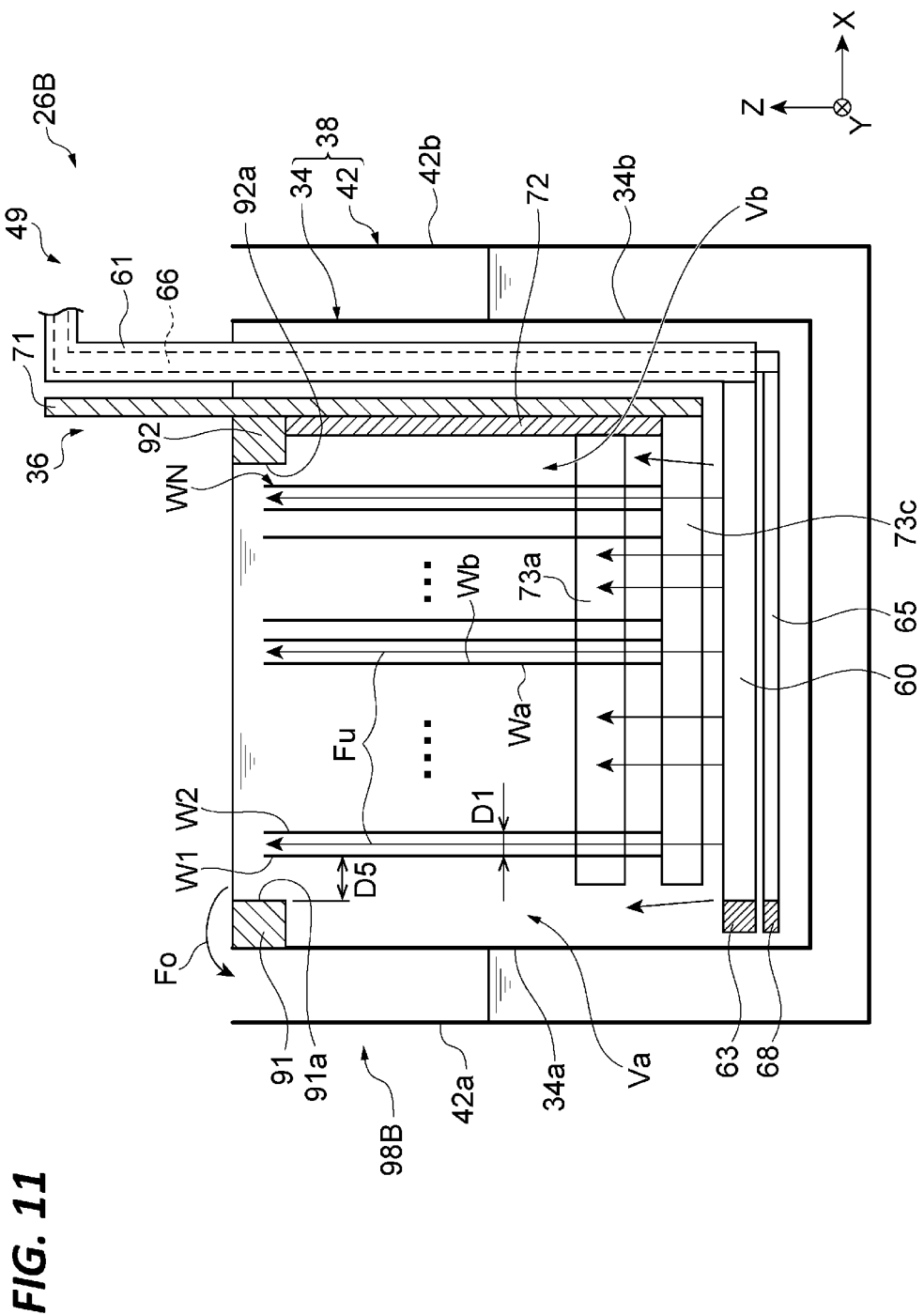
FIG. 11 is a schematic side view illustrating the configuration of a substrate liquid processing system according to a third embodiment.
Figure 12:
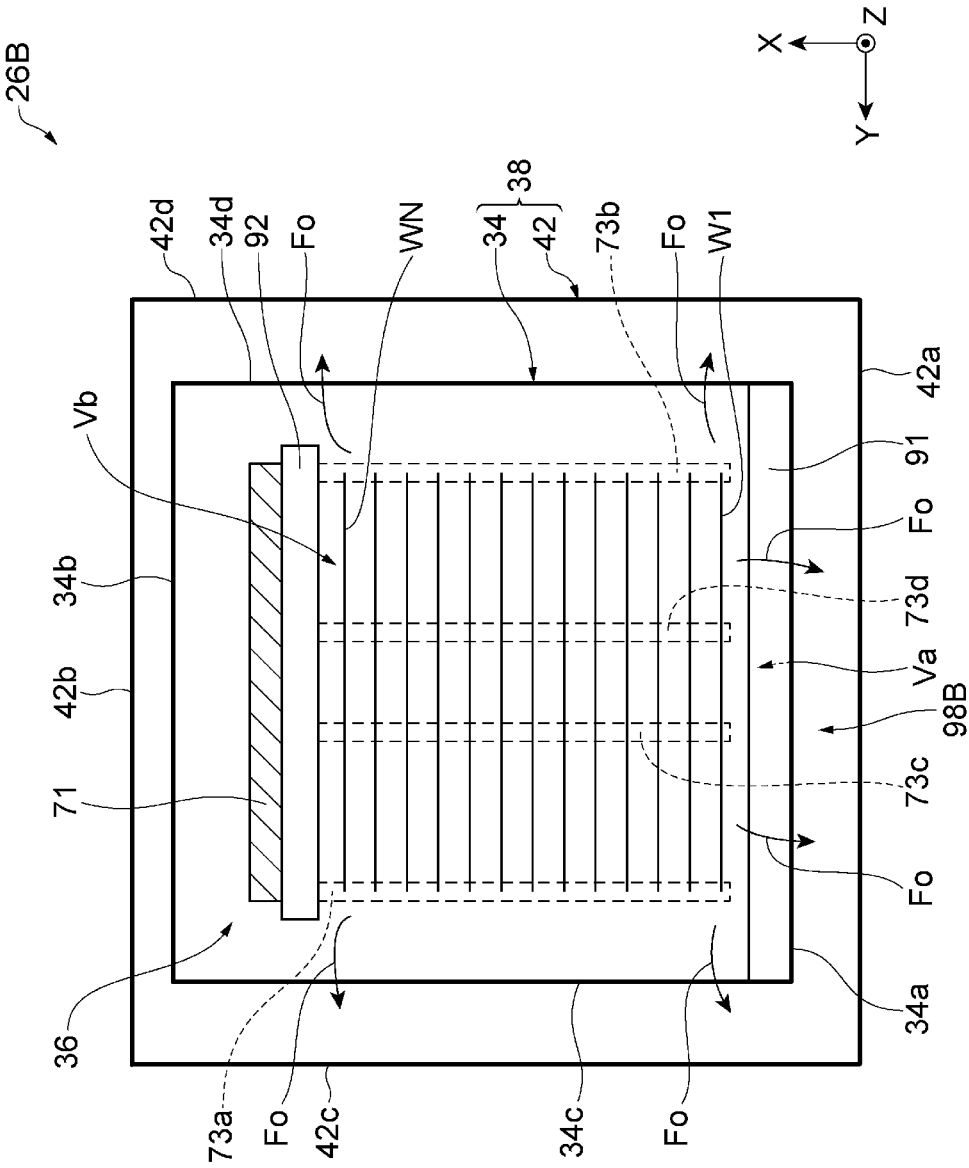
FIG. 12 is a schematic plan view illustrating the configuration of a substrate liquid processing apparatus.

The protruding member 91 illustrated in FIGS. 11 and 12 is a rod-shaped member extending along the inner surface of the side wall 34a (in the direction from the side wall 34c toward the side wall 34d). In the example illustrated in FIG. 11, the protruding member 91 has a quadrangular cross-sectional shape (a cross-sectional shape in a plane orthogonal to the longitudinal direction). The protruding member 91 is fixed to the inner surface of the side wall 34a in the side space Va and protrudes toward the substrate W1. The protruding member 91 has a facing surface 91a that faces the substrate W1. The facing surface 91a faces the upper end portion (upper end) of the substrate W1. The distance D5 (first distance) between the protruding member 91 and the substrate W1 may substantially coincide with the distance D1 (second interval) between the substrate W1 and the substrate W2, or may be made smaller than the distance D1. The distance D5 is the shortest distance between the facing surface 91a of the protruding member 91 and the main surface Wa of the substrate W1. The wording "the distance D5 substantially coincides with the distance D1" includes not only the case where the distance D5 completely coincides with the distance D1, but also the case where the distance D5 falls within the range of 0.95 to 1.05 times the distance D1. The distance D5 may be larger than the distance D1.

The protruding member 91 is provided at the upper end of the side wall 34a. For example, the height position of the upper surface of the protruding member 91 substantially coincides with the height position of the upper surface of the side wall 34a. As illustrated in FIG. 12, the lateral width (length in the Y-axis direction) of the protruding member 91 may be made longer than the lateral width of the substrate W1. For example, the lateral width of the protruding member 91 is substantially the same as the distance between the side wall 34c and the side wall 34d.

The protruding member 92 is a rod-shaped member extending along the main surface of the support plate 71 near the substrate WN (in the direction from the side wall 34c toward the side wall 34d). In the example illustrated in FIG. 11, the cross-sectional shape of the protruding member 92 (cross-sectional shape in a plane orthogonal to the longitudinal direction) is a quadrangle, and the cross-sectional size of the protruding member 92 is almost the same. The protruding member 92 is fixed to the support plate 71 of the substrate lifting mechanism 36 in the side space Vb, and protrudes toward the substrate WN. The protruding member 92 has a facing surface 92a that faces the substrate WN. The distance between the facing surface 92a and the substrate WN may substantially coincide with the distance D1 or may be made smaller than the distance D1.

As illustrated in FIG. 11, the protruding member 92 is disposed above the guide plate 72. The protruding member 92 is provided to correspond to the protruding member 91 in the height direction. For example, the height position of the upper surface of the protruding member 92 substantially coincides with the height position of the upper surface of the side wall 34b. As illustrated in FIG. 12, the lateral width of the protruding member 92 is longer than the lateral width of the substrate WN and smaller than the distance between the side wall 34c and the side wall 34d. That is, the protruding member 92 is spaced apart from both the side wall 34c and the side wall 34d.

In the etching apparatus 26B according to the third embodiment, the rectifying section 98B includes a protruding member 91 that protrudes from the inner surface of the side wall 34a toward the inside of the processing tank 34, that is, toward the substrate W1. The protruding member 91 extends along the side wall 34a in a direction intersecting the vertical direction. In this configuration, even if the descending flow Fd tends to flow along the main surface Wa of the substrate W1, the flow is blocked by the protruding member 92. As a result, disturbance of the ascending flow caused by the descending flow is suppressed, so that it is possible to improve the in-plane uniformity in liquid processing a substrate.

In the etching apparatus 26B, since the rectifying section 98B includes the protruding members 91, 92, the processing liquid that has risen to the vicinity of the upper end of the processing tank 34 in the side spaces Va and Vb is easily flows into the outer tank 42 as overflowing flow Fo. Further, since the protruding member 91 is provided at the upper end of the side wall 34a, the flow Fo flowing over the upper surface of the protruding member 91 and the side wall 34a is likely to occur. By providing the protruding member 92 on the support plate 71, the flow Fo avoiding the protruding member 92 and flowing over the side members 34c, 34d is likely to occur.

In the etching apparatus 26B, the distance D5 between the protruding member 91 and the substrate W1 substantially coincides with the distance D1 between the substrate W2 and the substrate W2 adjacent to the substrate W1 among the plurality of substrates 8, or is smaller than the distance D1. In this case, even if the descending flow Fd tends to flow into the side space Va, the descending flow Fd is hardly formed in the side space Va because the flow path in the side space Va is narrow. As a result, since the disturbance of the ascending flow Fu caused by the descending flow Fd is more reliably suppressed, the in-plane uniformity in liquid processing a substrate is achieved more reliably.

That the protruding members 91, 92 are not limited to the above-described configuration. The lateral width (the length in the Y-axis direction) of the protruding members 91, 92 may be substantially the same as the lateral width of the substrate W1, or may be narrower than the lateral width of the substrate W1. For example, the lateral width of the protruding members 91, 92 may be about ⅓ of the lateral width of the substrate W1, and the protruding members 91, 92 may be provided to correspond to the central area of the substrate W1 in the width direction. The protruding members 91, 92 may be constituted by a plurality of columnar bodies separated from each other, and the columnar bodies may extend in the Y-axis direction as a whole. The protruding members 91, 92 may be disposed so as to correspond to the area other than the upper end portion of the substrate W1. The upper surfaces of the protruding members 91, 92 may be lower than the upper surfaces of the side walls 34a, 34b.

Figure 13:
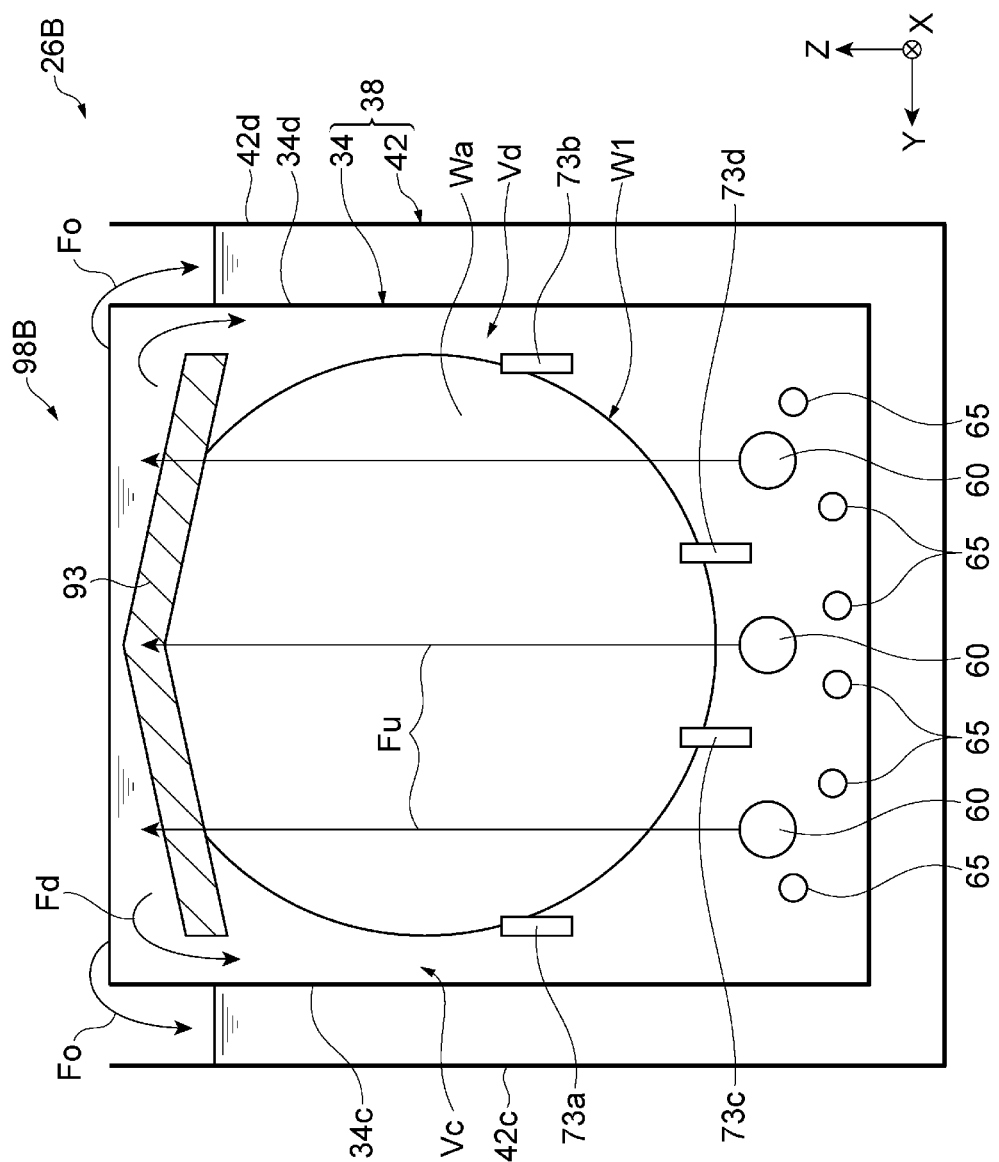
FIG. 13 is a schematic front view illustrating another example of the configuration of the substrate liquid processing apparatus.

FIG. 13 illustrates the configuration of the etching apparatus 26B in the case where the protruding member 91 is arranged along the peripheral edge of the upper end portion of the substrate W1 when viewed in a direction orthogonal to the main surface of the substrate W1. In this case, the rectifying section 98B has a protruding member 93 instead of the protruding member 91. The protruding member 93 illustrated in FIG. 13 extends along the side wall 34a to be inclined downward from the central position thereof corresponding to the upper end of the substrate W1 toward the opposite outer sides. That is, as viewed in a direction orthogonal to the main surface Wa of the substrate W1, the height position of the upper surface gradually decreases from the central position of the protruding member 93 toward the opposite outer ends of the protruding member 93. The apex of the protruding member 93 corresponding to the upper end of the substrate W1 is set to be lower than the upper surfaces of the side walls 34c and 34d.

In the etching apparatus 26B illustrated in FIG. 13, the protruding member 93 extends to be inclined downwardly from the central position corresponding to the upper end of the substrate W1 toward the opposite outer sides. In this case, the descending flow Fd that tends to flow toward the protruding member 93 flows so as to avoid the outside of the substrate W1 (the side spaces Vc, Vd) due to the inclination of the protruding member 93. For this reason, since the formation of the descending flow Fd flowing along the main surface Wa of the substrate W1 is prevented, it is possible to improve the in-plane uniformity in liquid processing a substrate.

Figure 14:
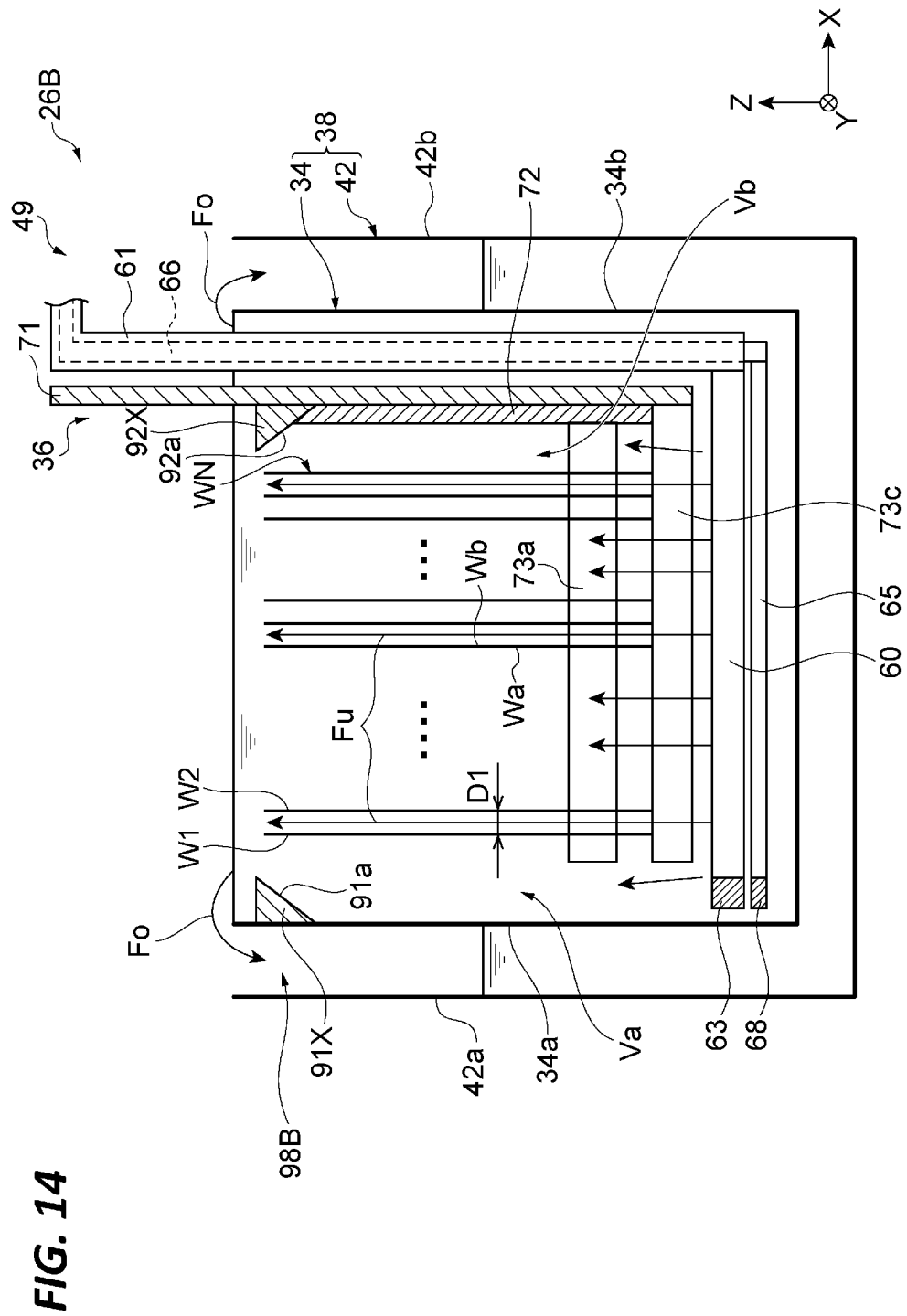
FIG. 14 is a schematic side view illustrating still another example of the configuration of the substrate liquid processing apparatus.

The cross-sectional shape of the protruding member 91 in the XZ plane is not limited to a rectangle. FIG. 14 illustrates the configuration of the etching apparatus 26B in the case where the cross-sectional shape of a protruding member in the plane orthogonal to the extending direction of the protruding member is a triangle. In this case, the rectifying section 98B includes protruding members 91X, 92X instead of the protruding members 91, 92. The protruding member 91X has a facing surface 91a (side surface) that faces the substrate W1. The facing surface 91a is inclined to approach the side wall 34a as it goes downward (away from the substrate W1). The protruding member 92X has a facing surface 92a (side surface) that faces the substrate WN. The facing surface 92a is inclined to approach the side wall 34b as it goes downward (away from the substrate WN). The upper surfaces of the protruding members 91X, 92X may be lower than the upper surfaces of the side walls 34a, 34b. The height positions of the upper surfaces of the protruding members 91X, 92X may be substantially the same as the height positions of the upper surfaces of the side walls 34a, 34b.

In the etching apparatus 26B illustrated in FIG. 14, the facing surface 91a of the protruding member 91X facing the substrate W1 is inclined to approach the side wall 34a as it goes downward. The facing surface 92a of the protruding member 92X facing the substrate WN is inclined to approach the side wall 34b as it goes downward. In this case, the flow of the processing liquid that has risen in the side spaces Va, Vb (ascending flow Fu) is hardly inhibited by the protruding members 91X, 92X. As a result, both the reliable execution of the liquid processing and the improvement of the in-plane uniformity are achieved.

Various embodiments disclosed above should be considered as illustrative and not restrictive in all aspects. The above-described embodiments may be omitted, replaced, and modified in various forms without departing from the scope and spirit of the appended claims.

The rectifying section 98 may adjust the flow of the processing liquid by including in combination two or more elements of the discharge hole 75a according to the first embodiment, the plate-shaped member 81 according to the second embodiment, and the protruding member 91 according to the third embodiment.

All the main surfaces Wa, Wb of a plurality of substrates 8 (substrates W1 to WN) do not have to extend along the YZ plane. It is sufficient if at least the main surfaces Wa and Wb of the substrate W1 among the substrates 8 extend along the YZ plane.

The present disclosure provides a substrate liquid processing apparatus that is effective for in-plane uniformity in processing a substrate during substrate liquid processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing tank configured to store a processing liquid for performing a liquid processing and including a first side wall;
   an outer tank formed to accommodate the processing tank therewithin and configured to store the processing liquid overflowing from the processing tank, the outer tank having a bottom wall positioned below a bottom wall of the processing tank;
   a substrate lifter including a support plate extending in a vertical direction and a substrate support connected to the support plate and configured to support a plurality of substrates such that main surfaces of each of the plurality of substrates follow the vertical direction in the processing tank; and
   a processing liquid ejector provided below the substrate lifter and configured to eject the processing liquid into the processing tank to generate an ascending flow of the processing liquid in the processing tank;

wherein the first side wall of the processing tank includes a first discharge hole configured to adjust the ascending flow of the processing liquid ejected by the processing liquid ejector in a side space formed between the first side wall of the processing tank and a first substrate among the plurality of substrates when the plurality of substrates are disposed on the substrate support, by discharging the processing liquid from the processing tank into the outer tank, and the support plate has a third discharge hole configured to adjust flow of the processing liquid in a second side space formed between the support plate and a last substrate among the plurality of substrates when the plurality of substrates are disposed on the substrate support, and when the processing liquid is ejected by the processing liquid ejector the third discharge hole is aligned with the first discharge hole in a horizontal direction and positioned below upper ends of the plurality of substrates when the plurality of substrates are disposed on the substrate support.

2. The substrate processing apparatus according to claim 1, wherein the first discharge hole is provided to face an upper end portion of the first substrate when the plurality of substrates are disposed on the substrate support.

3. The substrate processing apparatus according to claim 2, wherein the processing tank further includes a second side wall connected to the first side wall, the second side wall including a second discharge hole configured to discharge the processing liquid from the processing tank to the outer tank.

4. The substrate processing apparatus according to claim 2, further comprising a plate disposed in the side space, the plate is spaced apart from the first substrate and the first side wall when the plurality of substrates are disposed on the substrate support.

5. The substrate processing apparatus according to claim 2, wherein the first side wall includes a protruding portion that protrudes inward from an inner surface of the first side wall and extends along the first side wall in a direction crossing the vertical direction.

6. The substrate processing apparatus according to claim 1, wherein the processing tank further includes a second side wall connected to the first side wall, the second side wall including a second discharge hole configured to discharge the processing liquid from the processing tank to the outer tank.

7. The substrate processing apparatus according to claim 6, further comprising a plate disposed in the side space, the plate is spaced apart from the first substrate and the first side wall when the plurality of substrates are disposed on the substrate support.

8. The substrate processing apparatus according to claim 1, further comprising a plate disposed in the side space, the plate is spaced apart from the first substrate and the first side wall when the plurality of substrates are disposed on the substrate support.

9. The substrate processing apparatus according to claim 8, wherein a distance between the first substrate and the plate is smaller than a distance between the plate and the first side wall.

10. The substrate processing apparatus according to claim 8, wherein the first side wall includes a fixing member having one end connected to the first side wall and a second end connected to the plate, the fixing member being configured to fix the plate to the processing tank.

11. The substrate processing apparatus according to claim 8, wherein the substrate support extends in a direction that crosses the vertical direction to support the plurality of substrates from below, and the substrate support has one end fixed to the support plate and another end fixed to the plate.

12. The substrate processing apparatus according to claim 8, further comprising:

a fixing member having one end connected to the first side wall and another end connected to a first partition portion of the plate, the fixing member being configured to fix the first partition portion of the plate to the processing tank, wherein the plate includes the first partition portion and a second partition portion fixed to the substrate support, the first partition portion constitutes a portion of a main surface of the plate, the second partition portion constitutes another portion of the main surface of the plate, the main surface of the plate faces the first substrate when the plurality of substrates are disposed on the substrate support, and the substrate support extends in a direction that crosses the vertical direction to support the plurality of substrates from below.

13. The substrate processing apparatus according to claim 8, wherein the first side wall has a protruding portion that protrudes inward from an inner surface of the first side wall and extends along the first side wall in a direction that crosses the vertical direction.

14. The substrate processing apparatus according to claim 1, wherein the first side wall includes a protruding portion that protrudes inward from an inner surface of the first side wall and extends along the first side wall in a direction crossing the vertical direction.

15. The substrate processing apparatus according to claim 14, wherein a first distance between the protruding portion and the first substrate is substantially identical to or smaller than a second distance between a second substrate adjacent to the first substrate and the first substrate among the plurality of substrates when the plurality of substrates are disposed on the substrate support.

16. The substrate processing apparatus according to claim 14, wherein the protruding portion extends to be inclined downward toward opposite outer sides from a central position corresponding to an upper end of the first substrate.

17. The substrate processing apparatus according to claim 14, wherein a side surface of the protruding portion that faces the first substrate is inclined to approach the first side wall as it goes downward when the plurality of substrates are disposed on the substrate support.

18. The substrate processing apparatus according to claim 15, further comprising a plate disposed in the side space, wherein the plate is spaced apart from the first substrate and the first side wall, and a main surface of one side of the plate faces the first substrate when the plurality of substrates are disposed on the substrate support.

19. The substrate processing apparatus according to claim 15, wherein the first side wall includes a protruding portion that protrudes inward from an inner surface of the first side wall and extends along the first side wall in a direction crossing the vertical direction.

* * * * *